(12) United States Patent
Ebefors et al.

(10) Patent No.: US 9,620,390 B2
(45) Date of Patent: Apr. 11, 2017

(54) METHOD OF MAKING A SEMICONDUCTOR DEVICE HAVING A FUNCTIONAL CAPPING

(71) Applicant: Silex Microsystems AB, Jarfalla (SE)

(72) Inventors: Thorbjorn Ebefors, Huddinge (SE);
Edvard Kalvesten, Hagersten (SE);
Tomas Bauer, Bro (SE)

(73) Assignee: Silex Microsystems AB, Jarfalla (SE)

( * ) Notice: Subject to any disclaimer, the term of this patent is extended or adjusted under 35 U.S.C. 154(b) by 0 days.

(21) Appl. No.: 14/993,714

(22) Filed: Jan. 12, 2016

(65) Prior Publication Data
US 2016/0122180 A1 May 5, 2016

Related U.S. Application Data

(62) Division of application No. 13/130,264, filed as application No. PCT/SE2009/051311 on Nov. 19, 2009, now Pat. No. 9,362,139.

(30) Foreign Application Priority Data

Nov. 19, 2008 (SE) ...................................... 0850083

(51) Int. Cl.
*B81B 7/00* (2006.01)
*H01L 23/04* (2006.01)
(Continued)

(52) U.S. Cl.
CPC .............. *H01L 21/50* (2013.01); *B81B 7/007* (2013.01); *H01L 21/6835* (2013.01);
(Continued)

(58) Field of Classification Search
CPC . B81B 7/007; B81B 2207/095; H01L 23/642; H01L 23/645; H01L 23/647;
(Continued)

(56) References Cited

U.S. PATENT DOCUMENTS 4,313,151 A * 1/1982 Vranken ................. H01F 5/003
336/200
4,482,874 A * 11/1984 Rubertus ................. H01F 5/003
156/233
(Continued)

FOREIGN PATENT DOCUMENTS

EP    1900680 A3    11/2010
SE    0900590 A1    10/2010
(Continued)

*Primary Examiner* — Mary Wilczewski
(74) *Attorney, Agent, or Firm* — Pierce Atwood LLP; Kevin M. Farrell; David J. Wilson

(57) ABSTRACT

A wafer level method of making a micro-electronic and/or micro-mechanic device, having a capping with electrical wafer through connections (vias), comprising the steps of providing a first wafer of a semiconductor material having a first and a second side and a plurality of holes and/or recesses in the first side, and a barrier structure extending over the wafer on the second side, said barrier comprising an inner layer an insulating material, such as oxide, and an outer layer of another material. Then, metal is applied in said holes so as to cover the walls in the holes and the bottom of the holes. The barrier structure is removed and contacts are provided to the wafer through connections on the back-side of the wafer. Bonding structures are provided on either of said first side or the second side of the wafer. The wafer is bonded to another wafer carrying electronic and micro-electronic/mechanic components, such that the first wafer forms a capping structure covering the second wafer. Finally the wafer is singulated to individual devices.

8 Claims, 19 Drawing Sheets

(51) Int. Cl.
    *H01L 23/498*     (2006.01)
    *H01L 23/64*     (2006.01)
    *H01L 23/66*     (2006.01)
    *H01L 21/50*     (2006.01)
    *H01L 21/683*     (2006.01)
    *H01L 23/552*     (2006.01)
    *H01L 23/58*     (2006.01)
    *H01L 21/78*     (2006.01)
    *H01L 21/768*     (2006.01)
    *H01L 23/10*     (2006.01)
    *H01L 23/48*     (2006.01)
    *H01L 23/00*     (2006.01)

(52) U.S. Cl.
CPC ........ *H01L 23/04* (2013.01); *H01L 23/49827* (2013.01); *H01L 23/49838* (2013.01); *H01L 23/552* (2013.01); *H01L 23/585* (2013.01); *H01L 23/642* (2013.01); *H01L 23/645* (2013.01); *H01L 23/66* (2013.01); *H01L 24/03* (2013.01); *H01L 24/05* (2013.01); *H01L 24/29* (2013.01); *H01L 24/30* (2013.01); *B81B 2207/095* (2013.01); *H01L 21/76898* (2013.01); *H01L 21/78* (2013.01); *H01L 23/10* (2013.01); *H01L 23/481* (2013.01); *H01L 24/11* (2013.01); *H01L 24/13* (2013.01); *H01L 24/16* (2013.01); *H01L 24/27* (2013.01); *H01L 24/32* (2013.01); *H01L 24/33* (2013.01); *H01L 24/81* (2013.01); *H01L 24/83* (2013.01); *H01L 2221/68363* (2013.01); *H01L 2221/68372* (2013.01); *H01L 2223/6616* (2013.01); *H01L 2223/6622* (2013.01); *H01L 2223/6655* (2013.01); *H01L 2223/6677* (2013.01); *H01L 2224/0239* (2013.01); *H01L 2224/02311* (2013.01); *H01L 2224/02313* (2013.01); *H01L 2224/02371* (2013.01); *H01L 2224/02372* (2013.01); *H01L 2224/03462* (2013.01); *H01L 2224/0401* (2013.01); *H01L 2224/05073* (2013.01); *H01L 2224/05155* (2013.01); *H01L 2224/05548* (2013.01); *H01L 2224/05573* (2013.01); *H01L 2224/05644* (2013.01); *H01L 2224/1146* (2013.01); *H01L 2224/131* (2013.01); *H01L 2224/13009* (2013.01); *H01L 2224/13024* (2013.01); *H01L 2224/13083* (2013.01); *H01L 2224/13111* (2013.01); *H01L 2224/13144* (2013.01); *H01L 2224/13155* (2013.01); *H01L 2224/29009* (2013.01); *H01L 2224/29011* (2013.01); *H01L 2224/29012* (2013.01); *H01L 2224/29018* (2013.01); *H01L 2224/29101* (2013.01); *H01L 2224/29111* (2013.01); *H01L 2224/29144* (2013.01); *H01L 2224/3012* (2013.01); *H01L 2224/30051* (2013.01); *H01L 2224/81005* (2013.01); *H01L 2224/81203* (2013.01); *H01L 2224/81801* (2013.01); *H01L 2224/83005* (2013.01); *H01L 2224/83203* (2013.01); *H01L 2224/83801* (2013.01); *H01L 2224/83805* (2013.01); *H01L 2924/014* (2013.01); *H01L 2924/0105* (2013.01); *H01L 2924/01005* (2013.01); *H01L 2924/01006* (2013.01); *H01L 2924/01013* (2013.01); *H01L 2924/01029* (2013.01); *H01L 2924/0132* (2013.01); *H01L 2924/01033* (2013.01); *H01L 2924/01051* (2013.01); *H01L 2924/01072* (2013.01); *H01L 2924/01079* (2013.01); *H01L 2924/01322* (2013.01); *H01L 2924/1461* (2013.01); *H01L 2924/19041* (2013.01); *H01L 2924/19042* (2013.01); *H01L 2924/19043* (2013.01); *H01L 2924/3011* (2013.01); *H01L 2924/3025* (2013.01); *H01L 2924/30105* (2013.01); *H01L 2924/30107* (2013.01)

(58) Field of Classification Search
CPC ......... H01L 23/49827; H01L 23/49838; H01L 2223/6616; H01L 2223/6622; H01L 2223/6655; H01L 2223/6677; H01L 2224/02371; H01L 2224/02372; H01L 2924/19041; H01L 2924/19042; H01L 2924/19043; H01L 2924/30101; H01L 2924/30105; H01L 2924/30107; H01L 2924/311

See application file for complete search history.

(56) References Cited

U.S. PATENT DOCUMENTS

| | | | | |
|---|---|---|---|---|
| 4,578,654 | A * | 3/1986 | Tait | G06K 19/0672 333/167 |
| 5,016,342 | A * | 5/1991 | Pisharody | G11B 5/31 29/603.15 |
| 5,095,357 | A * | 3/1992 | Andoh | H01F 17/0006 257/379 |
| 5,189,580 | A * | 2/1993 | Pisharody | G11B 5/31 360/122 |
| 5,336,921 | A * | 8/1994 | Sundaram | H01L 27/08 257/531 |
| 5,384,274 | A * | 1/1995 | Kanehachi | H01L 27/08 257/E27.046 |
| 5,479,695 | A * | 1/1996 | Grader | H01F 17/0033 156/89.28 |
| 5,581,141 | A * | 12/1996 | Yamada | H03H 9/0028 310/313 B |
| 5,703,740 | A * | 12/1997 | Cohen | G11B 5/3113 360/123.15 |
| 5,793,272 | A * | 8/1998 | Burghartz | H01F 17/0006 336/200 |
| 5,831,331 | A * | 11/1998 | Lee | H01L 23/645 257/277 |
| 5,852,866 | A * | 12/1998 | Kuettner | H01F 17/0006 29/602.1 |
| 5,936,298 | A * | 8/1999 | Capocelli | H01F 17/0033 257/531 |
| 5,936,593 | A * | 8/1999 | Mandai | H01Q 1/362 343/700 MS |
| 6,031,445 | A * | 2/2000 | Marty | H01F 27/2804 257/E21.022 |
| 6,097,273 | A * | 8/2000 | Frye | H01F 5/003 333/25 |
| 6,114,938 | A * | 9/2000 | Iida | H01F 17/0006 257/531 |
| 6,116,863 | A * | 9/2000 | Ahn | F04B 43/043 417/322 |
| 6,218,925 | B1 * | 4/2001 | Iwao | H01F 17/0013 336/200 |
| 6,249,039 | B1 * | 6/2001 | Harvey | H01F 17/0006 257/528 |
| 6,268,796 | B1 * | 7/2001 | Gnadinger | G06K 19/0726 257/673 |
| 6,846,725 | B2 | 1/2005 | Nagarajan et al. | |
| 6,853,067 | B1 | 2/2005 | Cohn et al. | |
| 7,326,629 | B2 | 2/2008 | Nagarajan et al. | |
| 7,446,424 | B2 | 11/2008 | Lu et al. | |
| 7,508,291 | B2 * | 3/2009 | Matsumoto | H01F 19/04 336/200 |
| 7,855,498 | B2 * | 12/2010 | Waffenschmidt | H01L 51/5203 313/495 |
| 7,936,245 | B2 * | 5/2011 | Huang | H01F 17/0006 336/200 |
| 8,786,393 | B1 * | 7/2014 | Chen | H01F 19/08 336/173 |

(56) References Cited

U.S. PATENT DOCUMENTS

| | | | |
|---|---|---|---|
| 8,826,514 B2* | 9/2014 | Papavasiliou | H01F 17/0013 29/602.1 |
| 2002/0172025 A1* | 11/2002 | Megahed | H01L 23/3677 361/767 |
| 2004/0259325 A1 | 12/2004 | Gan | |
| 2005/0224989 A1 | 10/2005 | Myers et al. | |
| 2006/0055495 A1* | 3/2006 | Rategh | H01F 17/0006 336/200 |
| 2006/0286798 A1 | 12/2006 | Lee et al. | |
| 2007/0045780 A1 | 3/2007 | Akram et al. | |
| 2008/0048816 A1* | 2/2008 | Matsumoto | H01F 19/04 336/200 |
| 2008/0081398 A1 | 4/2008 | Lee et al. | |
| 2008/0173993 A1 | 7/2008 | Andry et al. | |
| 2010/0225436 A1* | 9/2010 | Papavasiliou | H01F 17/0013 336/200 |
| 2010/0252898 A1 | 10/2010 | Tanaka et al. | |
| 2010/0295648 A1* | 11/2010 | Huang | H01F 17/0006 336/200 |
| 2011/0073987 A1* | 3/2011 | Mackh | H01L 21/76898 257/531 |
| 2011/0131798 A1* | 6/2011 | Papavasiliou | H01F 17/0013 29/602.1 |
| 2012/0086102 A1* | 4/2012 | Hofmann | H01F 41/046 257/531 |
| 2013/0293336 A1* | 11/2013 | Lo | H01F 27/2804 336/200 |
| 2014/0068932 A1* | 3/2014 | Sturcken | H05K 1/115 29/832 |
| 2014/0071636 A1* | 3/2014 | Sturcken | H05K 1/115 361/748 |
| 2014/0217183 A1* | 8/2014 | Yosui | H01Q 1/2225 235/492 |
| 2014/0240071 A1* | 8/2014 | Alderton | H01F 17/0013 336/200 |
| 2014/0247269 A1* | 9/2014 | Berdy | H01F 1/24 345/501 |
| 2015/0035639 A1* | 2/2015 | Nakamura | H01F 17/0033 336/200 |

FOREIGN PATENT DOCUMENTS

| | | |
|---|---|---|
| WO | 2007089206 A1 | 8/2007 |
| WO | 2008091220 A1 | 7/2008 |
| WO | 2008091221 A3 | 7/2008 |
| WO | 2009005462 A1 | 1/2009 |

* cited by examiner

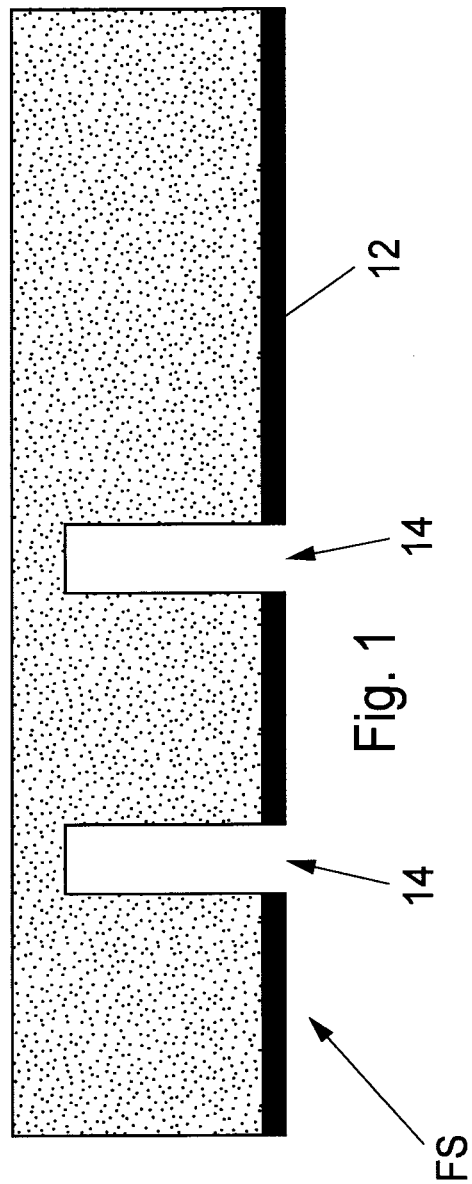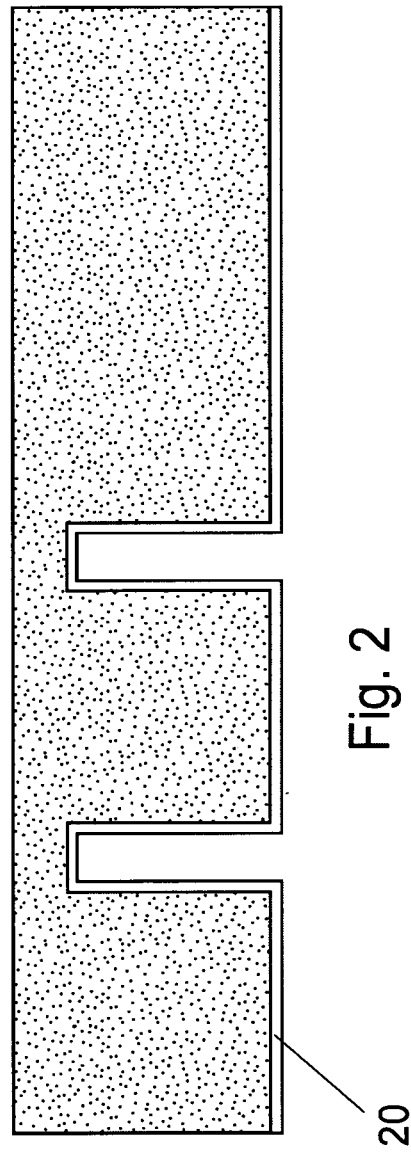

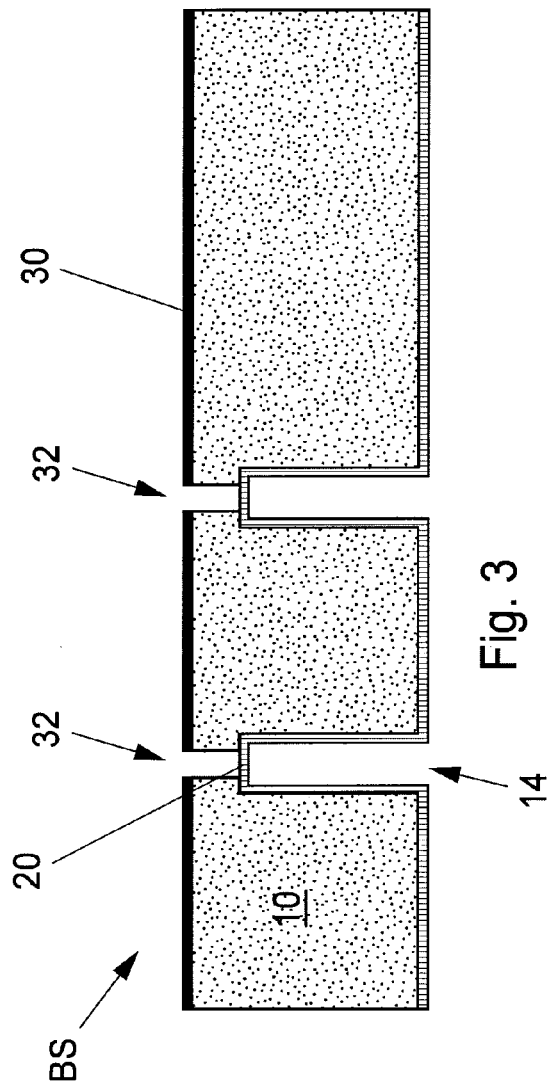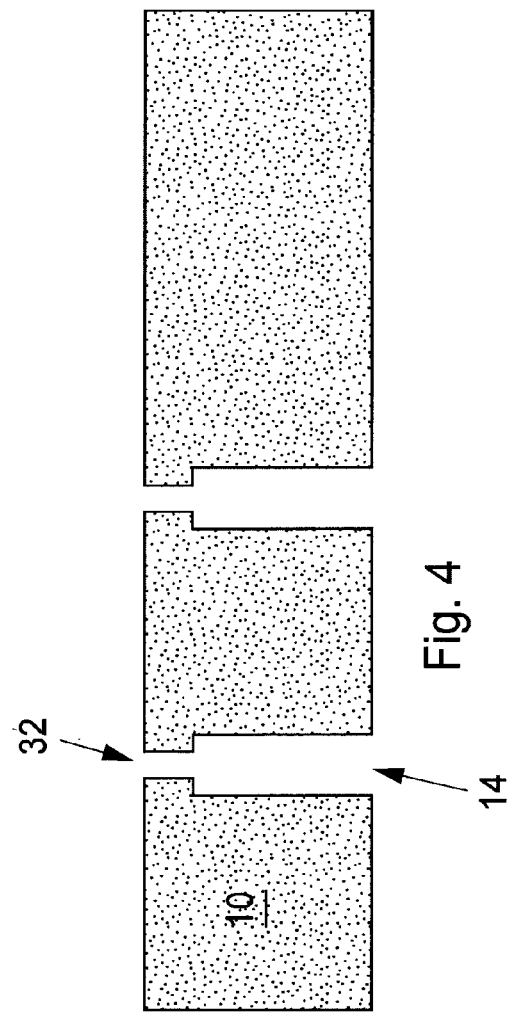

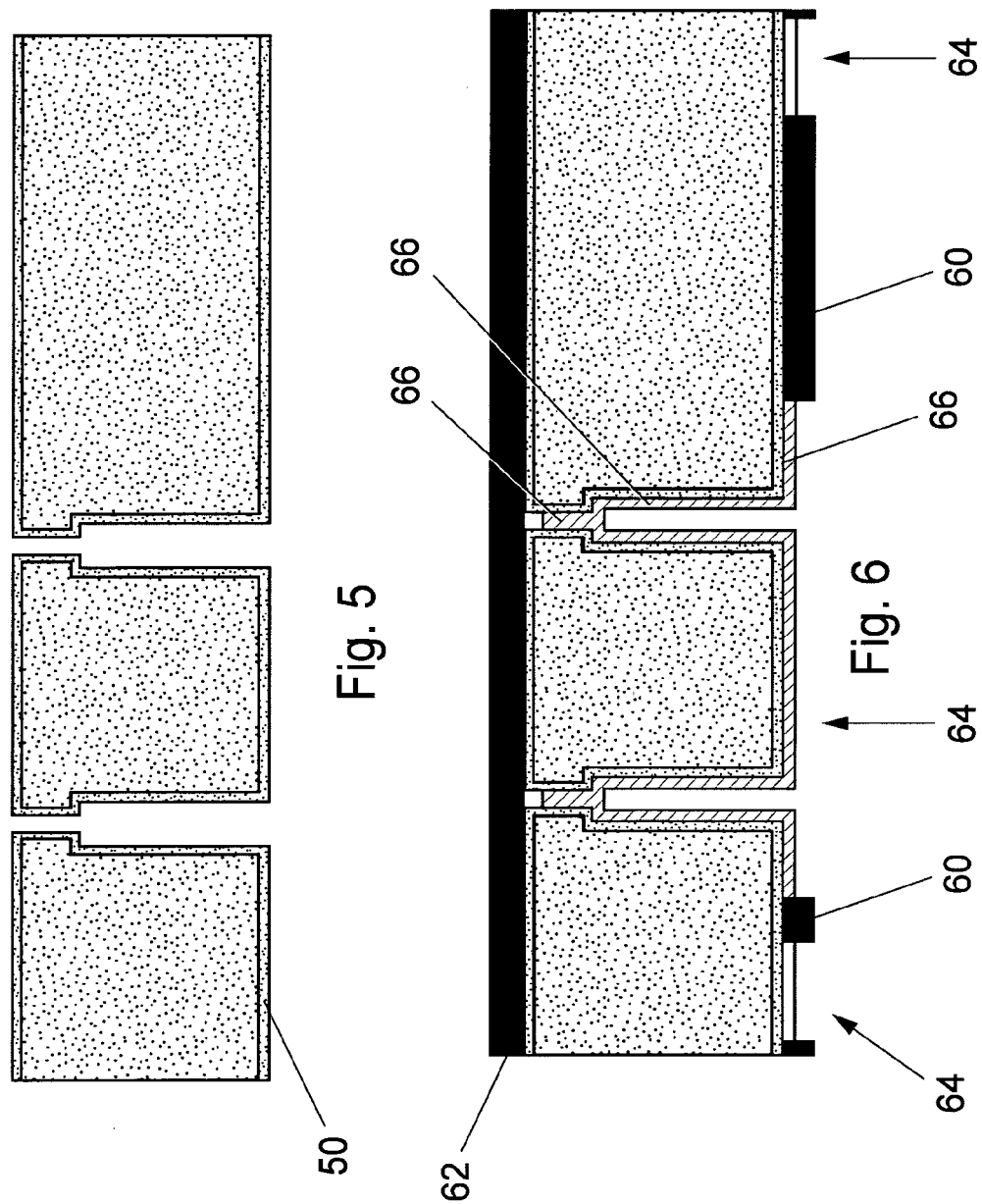

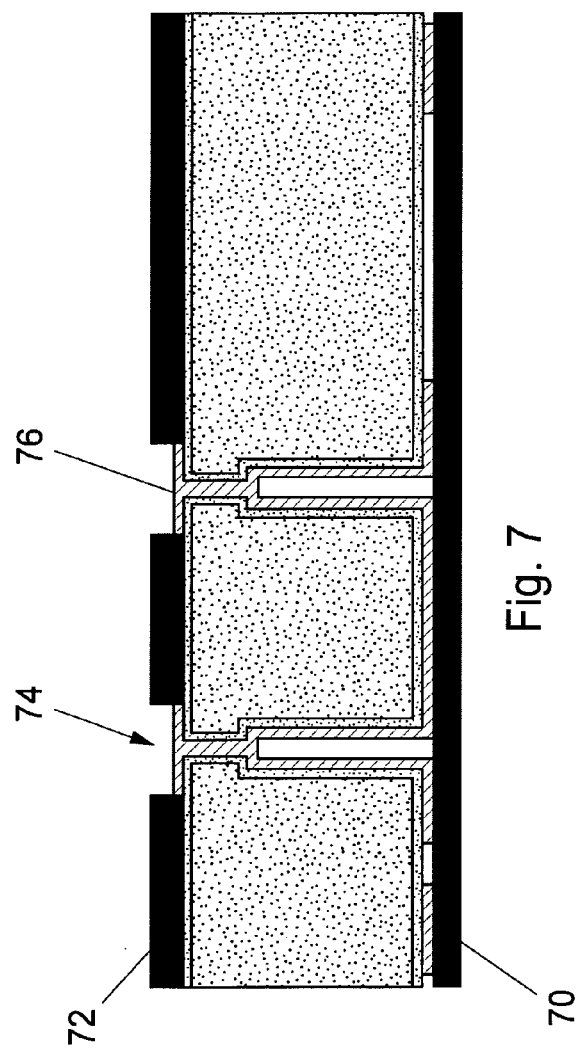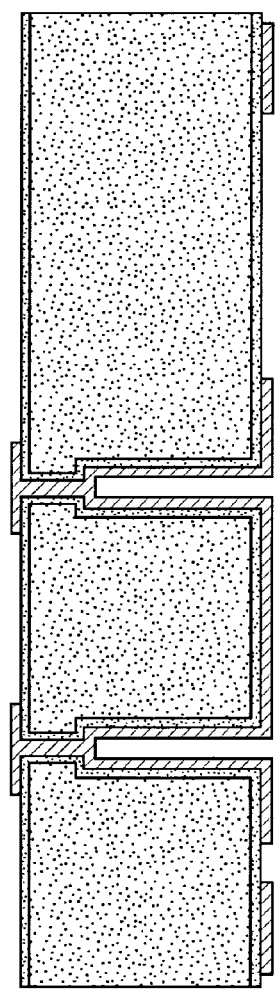
Fig. 7
Fig. 8

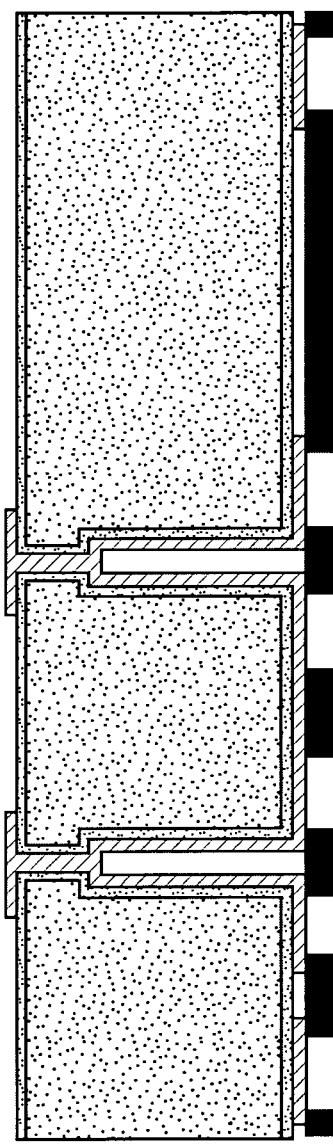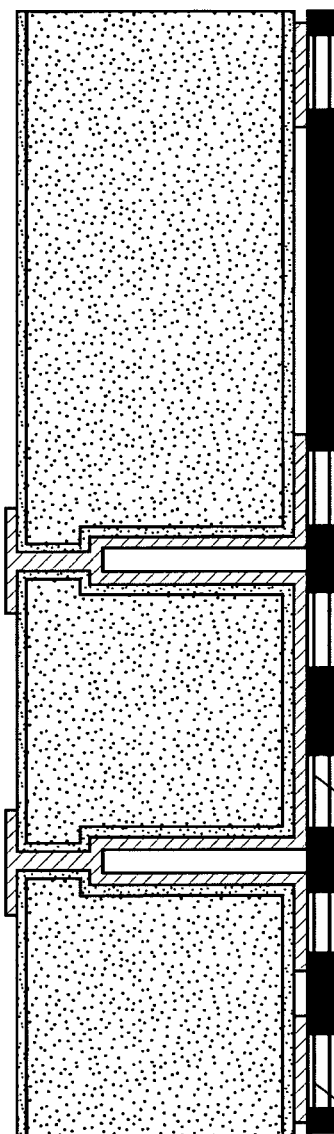

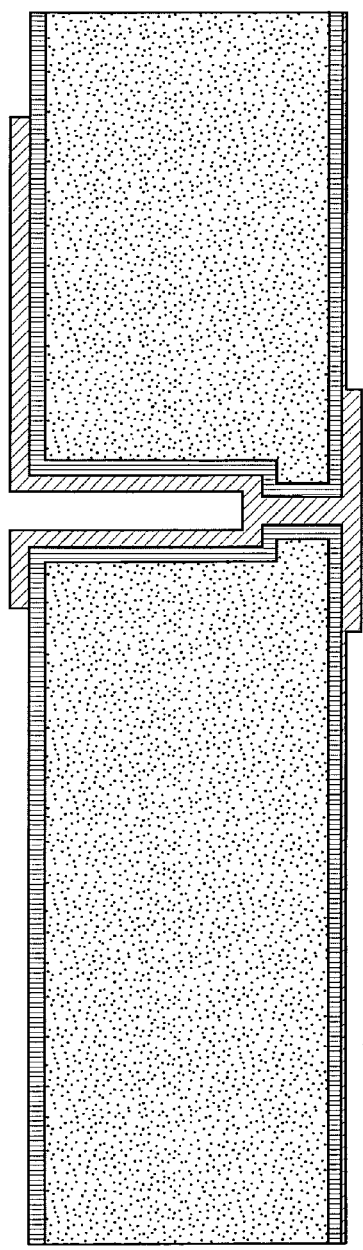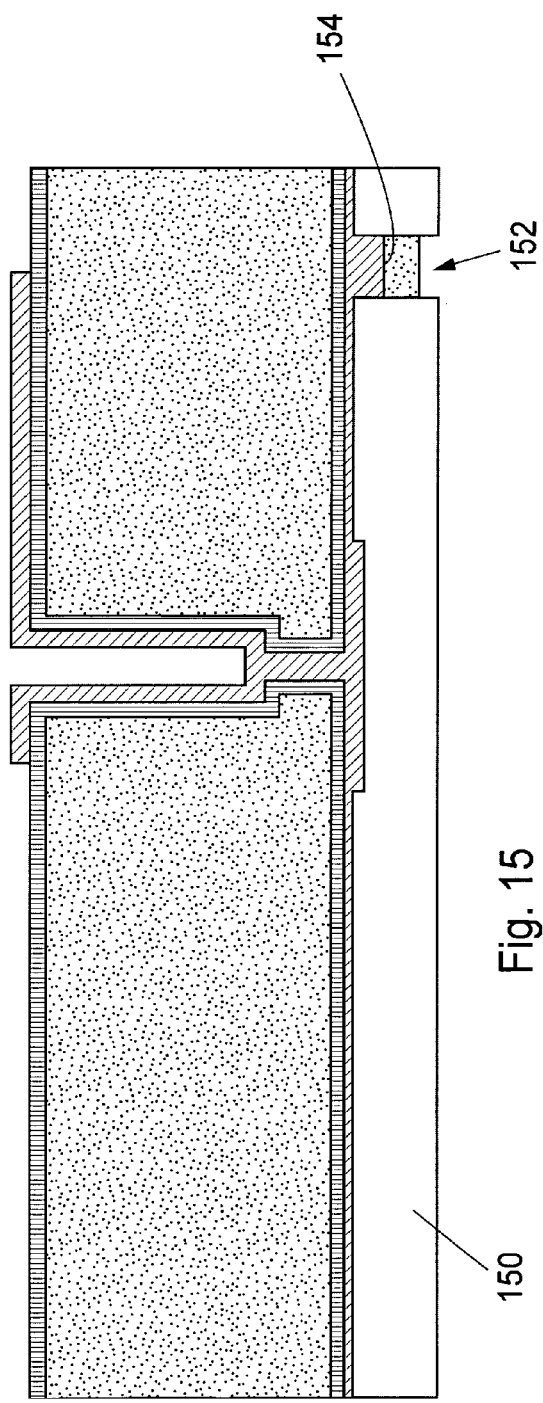

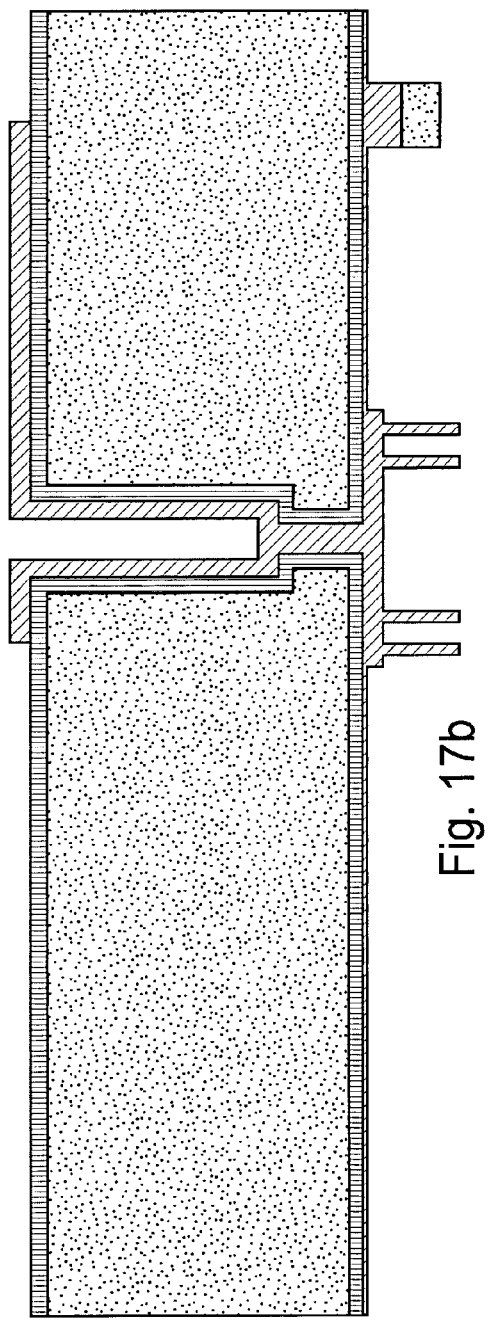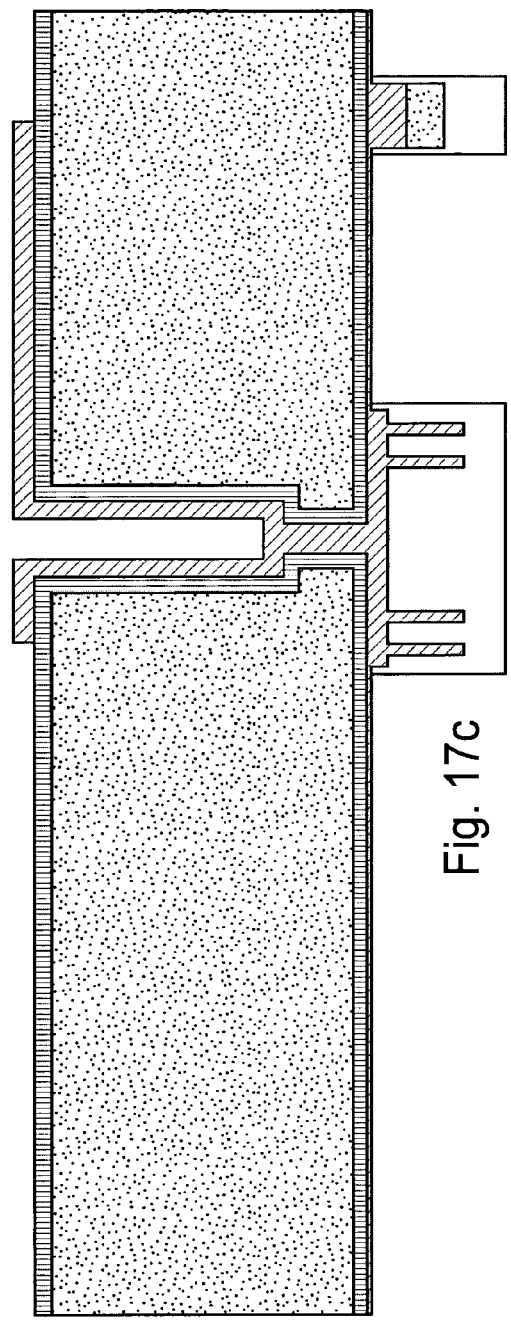

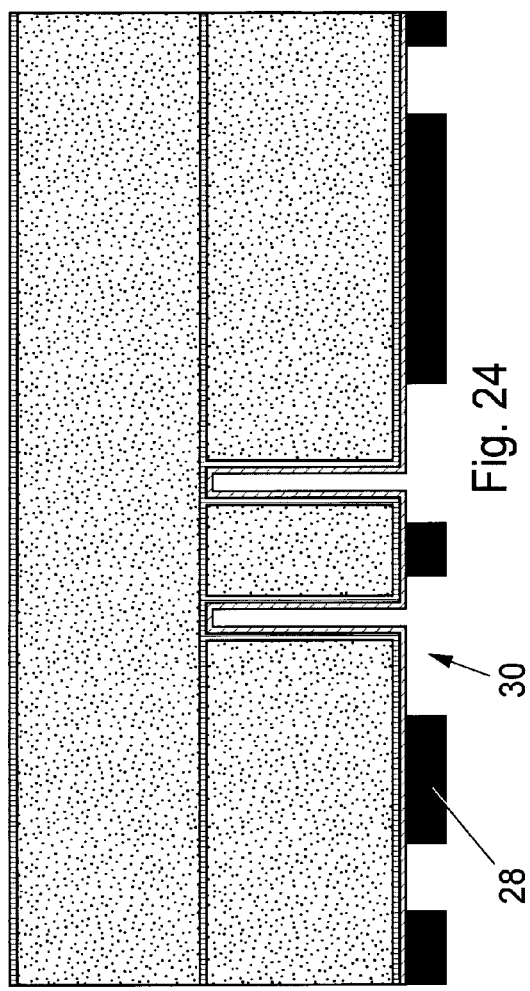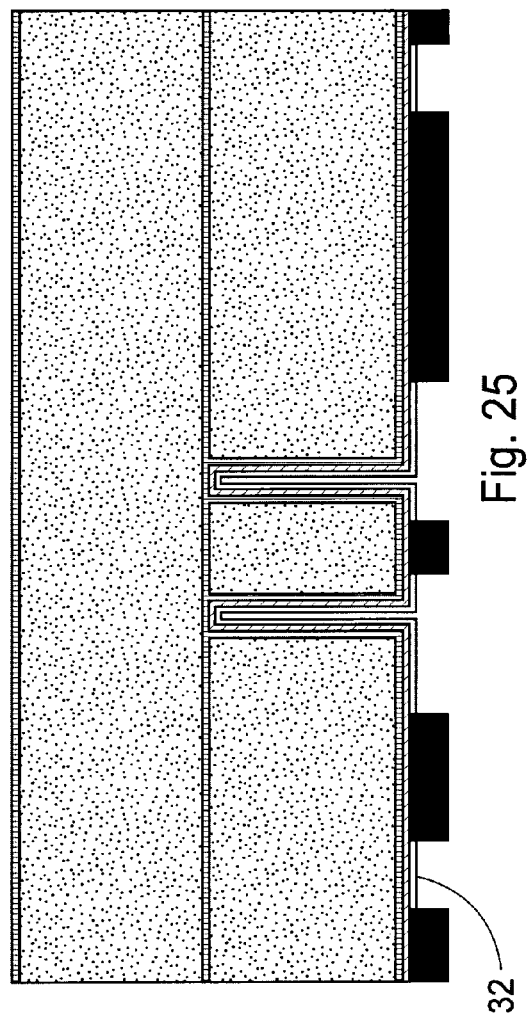

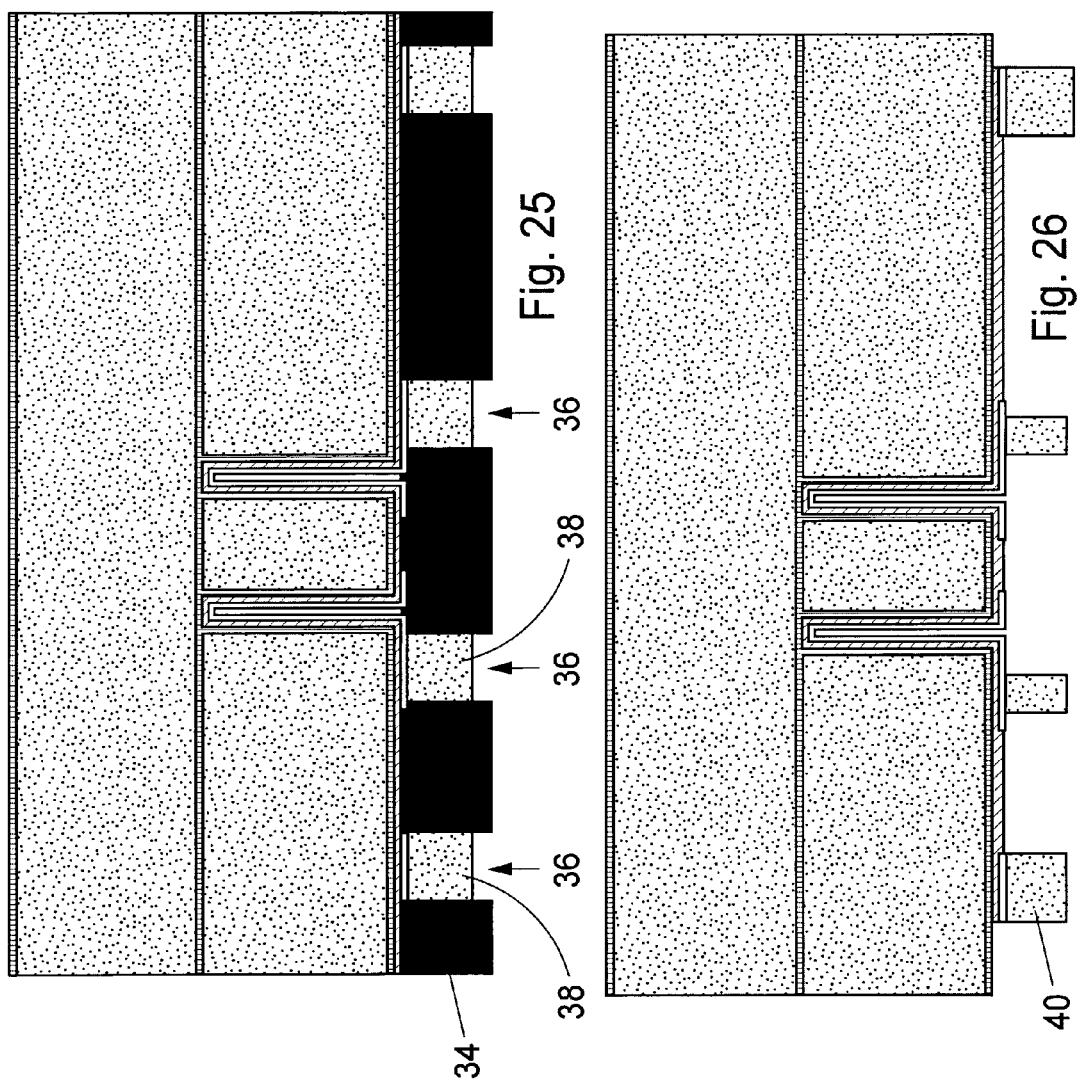

METHOD OF MAKING A SEMICONDUCTOR DEVICE HAVING A FUNCTIONAL CAPPING

The present invention relates to packaging of semiconductor devices, and in particular to a capping substrate comprising functional features.

BACKGROUND OF THE INVENTION

In so called packaging of semiconductor devices it is sometimes required to enclose various components in a controlled atmosphere, i.e. to seal a cavity in a controlled atmosphere, in some cases, even most often to form a hermetic seal.

This procedure entails bonding two wafers together often under pressure and with heating. This is a delicate task when wafers are thin because they easily break. Representative prior art for this field of technology are WO 2007/089206, WO 2008/091220, WO 2008/091221, and SE-0900590-1 (not published) all assigned to Silex Microsystems, and WO 2009/005462 (Nilsson et al). These documents describe various aspects of through silicon insulator technology, such as through silicon vias (TSV), "zero cross-talk" and wafer level micro-scale packaging of discrete or monolithic integrated components.

In US 2004/0259325 (Qing Gan) there is disclosed a wafer level chip scale hermetic seal package. It comprises providing a capping structure having a cavity for housing components on a device substrate, and vias extending through the capping structure for routing electrical signals from the cavity and through the capping. The vias appear to be made by etching holes entirely through the wafer and then filling the vias by electroplating Cu in them. The depth of these vias is said to be limited to 20-300 µm and the cross-sectional dimension 5-50 µm.

SUMMARY OF THE INVENTION

The present invention provides a method of making semiconductor devices comprising micro-mechanical and micro-electronic components, including but not limited to CMOS components, NMOS, PMOS, bipolar, thin or thick film passive or active devices in micro-scale and/or MEMS components such as inertial structures, gyros, accelerometers, switches in micro-scale, in a hermetically sealed cavity, without risk of damaging the capping structure. It also provides for integrating various types of electric functionalities in the capping structure, functionalities that are not process compatible with the temperature sensitive CMOS structures. Also the prior art technologies making use of thin film structures for passive integrated devices such as resistance inductors and capacitors most often require large surface areas and hence are not cost effective.

Thus, in a first aspect the invention provides a general method of making semiconductor devices comprising micro-mechanical and/or micro-electronic components, having a capping structure. The method according to the invention is defined in claim 1.

In one embodiment the method according to the invention entails using an SOI (Silicon On Insulator) wafer for making the capping structures, whereby the vias are made in the layer defined as the device layer, while maintaining the other layer defined as the handle layer. This approach will ascertain stability and robustness in the process, and substantially reduce, if not entirely eliminate the risk of damage of wafers during manufacture.

In another embodiment of the method according to the invention an ordinary silicon wafer is used without the need for carrier handling, but this will require a thicker substrate in order to provide the necessary robustness for enabling the handling during processing of the wafer.

In a second aspect the invention provides a functional capping structure for a semiconductor device comprising micro-mechanical and/or micro-electronic components, such as a MEMS and/or CMOS device, the capping structure preferably has a hermetically sealed cavity for housing the components on such devices.

Also according to the invention there is provided a micro-mechanical and/or micro-electronic (MEMS and/or CMOS) device having a capping, preferably with a hermetically sealed cavity.

BRIEF DESCRIPTION OF THE DRAWINGS

FIG. 1-13 shows a process flow for one embodiment of the method according to the present invention;

FIG. 14-19 shows a process flow for another embodiment of the method according to the present invention FIG. 20-27 shows a process flow for still another embodiment of the method according to the present invention;

DETAILED DESCRIPTION OF THE INVENTION

Figure 11:
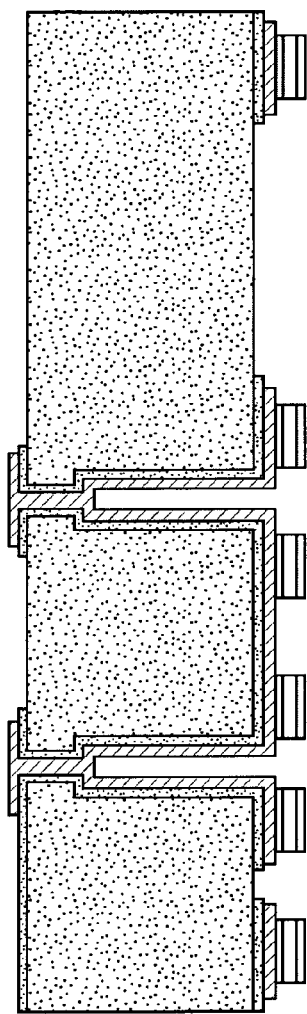

The present invention is based on the inventive concept of using a method for making a "metal via substrate", i.e. a substrate having impedance adapted electrical through connections of metal, for RF applications, and in the same process sequence in said method optionally making a plurality of passive components, e.g. resistors, capacitors and/or inductances, said passive components extending through the substrate. Such a metal via substrate is suitable for use in hermetic capping of electronic and micro-electronic/mechanic structures in general, including but not limited to CMOS components, NMOS, PMOS, bipolar, thin or thick film passive or active devices in micro-scale and/or MEMS components such as inertial structures, gyros, accelerometers, switches in micro-scale, CMOS and/or MEMS devices, e.g. CMOS structures comprising switches.

The invention can be used to make a single transmitter/receiver chip integrated with switches and RCL filters that filters out correct frequency and switches it on to the antenna in the mobile phone or into the receiving chip. Provision of such RF switching enables selection of which band (frequency) one wishes to use; 900 MHz (GSM) 1800 or 1900 MHz (3G Europe and US, respectively), 2800 MHz and other frequencies for Bluetooth and the different WLAN standards. The RLC devices could then also be used as antennas or integrated antennas for sending and receiving signals.

Generally, the method according to the present invention for making semiconductor devices comprising micro-mechanical and micro-electronic components an having a capping structure for such devices, e.g. CMOS and/or MEMS devices, comprises the following steps.

A starting substrate in the form of a semiconductor wafer, preferably a silicon wafer is provided, having a first and a second side. The wafer has been processed to a plurality of holes and/or recesses in the first side, and a barrier structure extending over the essentially entire wafer on the second side, said barrier comprising an inner insulating layer, suitably oxide but other insulating materials capable of withstanding the processing are usable, and an outer layer of another material. The alternative processing methods for arriving at the starting substrate will be described in more detail below, in connection with embodiments of the invention.

Thus, in one embodiment the holes in the starting substrate can have a uniform cross-section, such as a cylindrical hole, and in another embodiment the holes can have a section exhibiting one diameter and a second section having a smaller diameter.

Furthermore, the starting substrate has a barrier structure on the second side, said barrier structure forming the bottom of the holes. This barrier structure can extend essentially over the entire wafer on the second side, but a minimum requirement is that it covers the holes. The barrier comprises an inner layer of an insulating material, such as oxide, and an outer layer of another material.

Metal is applied in the holes, only covering the walls and the bottom of the holes or trenches, i.e. not filling the holes entirely. Also the bottom of the holes will be provided with metal thereby obtaining hermetic type connections. The reason for this being that if the hole density is large (sometimes as many as several hundred thousand holes can be provided on one wafer), entirely filled holes would cause severe problems during processing. Namely, process temperatures would cause heating of the wafer, and would cause expansion of the metal in the holes to a degree that the silicon wafer would crack. However, in the embodiment having holes with a narrow section the narrow holes are preferably entirely filled with metal. Since these sections are narrow, the filling will not have the same effect upon heating as if the wider holes were filled. The holes now coated inside with metal form structures that eventually will be wafer through connections (vias).

The barrier is removed after the metal has been applied and the wafer does not have any open through holes. Open through holes prevent the use of ordinary IC manufacturing equipment such as cassette-to-cassette wafer handling with robots and electrostatic or vacuum clamping of the wafers on different chucks in the processing machines.

Larger recesses can be made in the wafer, at least some of which are adapted to form cavities with a controlled atmosphere, preferably hermetically sealed, in the finished device to confine micromechanical and/or microelectronic components of e.g. a CMOS (in a general sense) device and/or a MEMS device.

However, if the components on the wafer to which the capping is to be bonded do not protrude very much or perhaps not at all, it may be sufficient to use the bonding structures as spacers to create a space large enough for accommodating the components. Thereby the height of the bonding structures can be adapted to the wafer topography.

The wafer having metallised holes and/or trenches is bonded to a wafer having components provide on its surface, e.g. CMOS and/or MEMS wafer whereby at least some of said recesses will house the active components on the CMOS and/or MEMS wafer.

If desired, routing structures are provided on the surface (s) of the wafers, preferably before they are bonded together, and optionally pad bumping suitable for surface mounting.

Now a preferred process for making a device having a capping substrate as disclosed above and comprising optional functionalities will be described.

Figure 20:
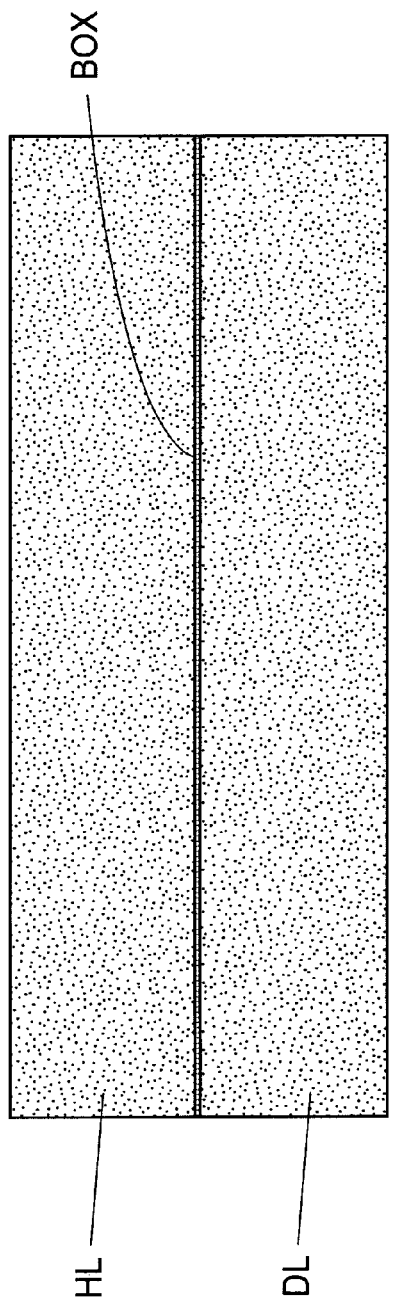
Figure 21:
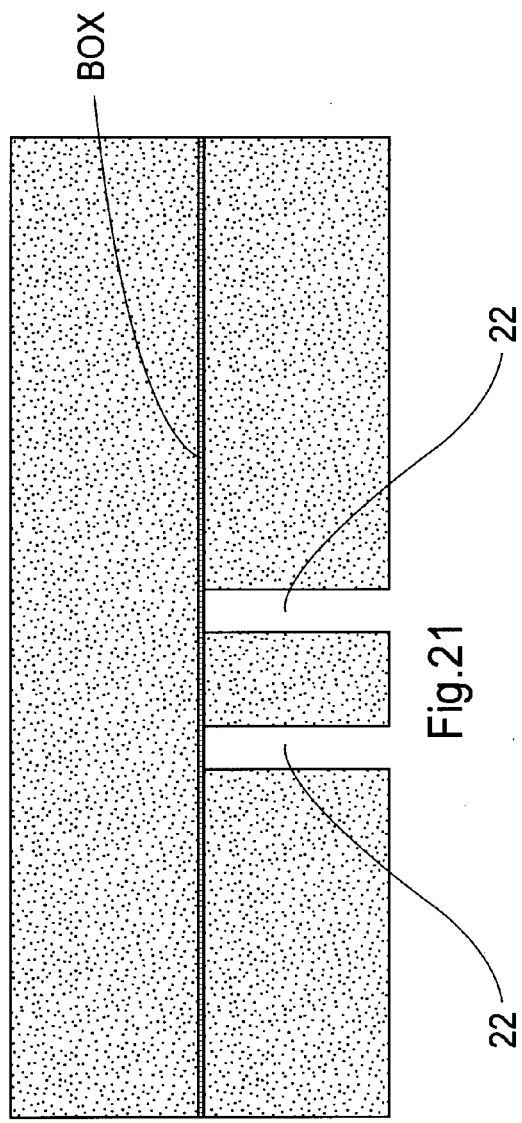
Figure 22:
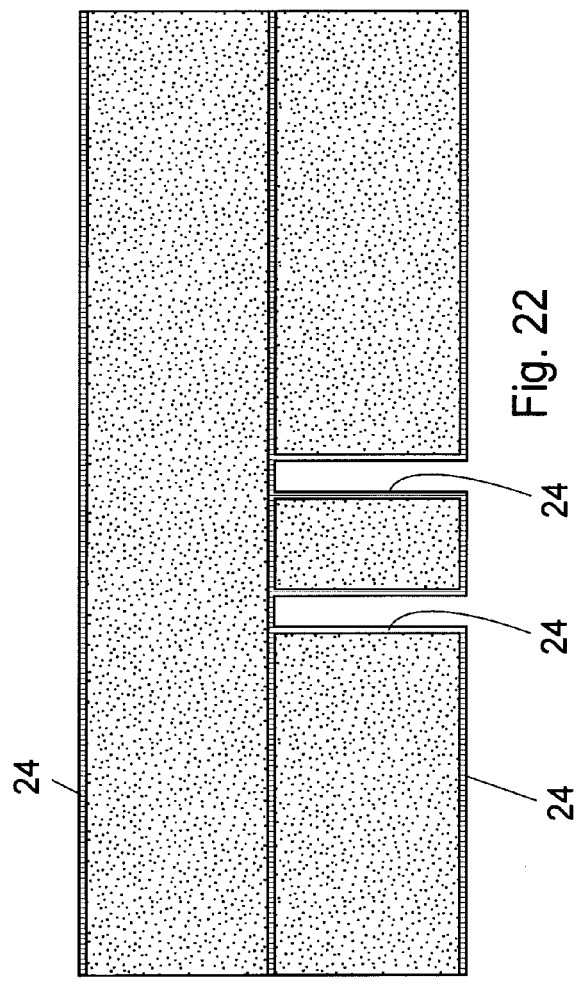
Figure 23:
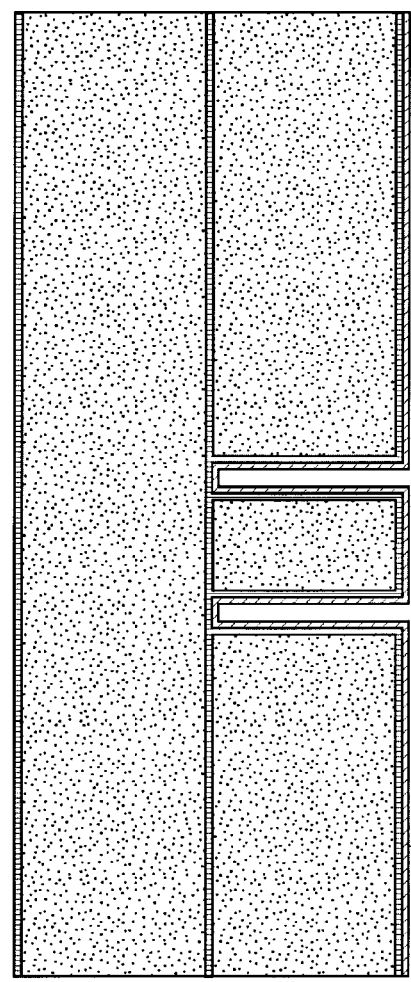

The process utilizes a so called SOI (Silicon On Insulator) wafer as a starting substrate, FIG. 20. An SOI wafer has a relatively thin so called device layer DL in which processing is performed, and a much thicker handle layer HL, for ease of handling the wafer. Between device layer and handle layer there is an insulating, buried oxide layer BOX, which acts as a etch stop layer in the processing. The handle layer and the buried oxide together form what above is referred to as the barrier structure, and the handle layer as such also has the function of a carrier. The handle layer is subsequently removed. Layers are not shown to scale.

A first step in the process according to this embodiment of the invention is to pattern the device layer of the SOI wafer as required for making the components. For example parallel trenches are formed (suitably by DRIE; Deep Reactive Ion Etching) for the purpose of making capacitors and for making the cores for inductances, and holes are etched for providing via structures. The trenches and holes 22 are etched down to the insulating etch stop layer BOX. In this way well defined trenches and holes are obtained.

Then the entire wafer is oxidized to provide a thin insulating layer 24 on the wafer and in all holes and trenches. A seed-layer 26 of conductive material, such as metal, e.g. Cu or Au provided e.g. by sputtering, evaporation or plating, or plasma deposited poly-silicon, for facilitating subsequent metallization, e.g. by electroplating or electroless plating. This seed-layer also can act as an interdiffusion metal barrier avoiding the thick metal in the through wafer connection to diffuse laterally into the insulator and further into the silicon.

In order to define where the metallization is to be deposited, a resist layer 28 is applied to the wafer, either by film lamination of a resist film or by spin coating.

Areas 30 for metallization are opened up in the resist 28, and metal is deposited by e.g. electroplating. As metal Cu is suitably used, but Au is also possible. It is important that the metal is coated as a layer on the inner surfaces of the holes only, such that the vias are not filled, i.e. they will not be solid but still hermetically tight.

If Au is used to make the metal via structures, subsequent bonding with a component wafer, e.g. a CMOS/MEMS wafer, can be made directly to the deposited Au. However, if Cu is used there is required to provide a solder structure.

Thus, when the Cu metal has been properly deposited in the vias, the resist mask 28 is removed and a new resist layer 34 is applied, again by lamination or by spinning. Holes and recesses 36 are opened up in the resist, thus forming what is referred to as a resist mold, and bonding material 38 is applied, suitably by plating in the resist mold. The resist 34 is removed and the capping structure shown in FIG. 26 results, having suitable bonding members 40 extending up from the surface.

Figure 27:
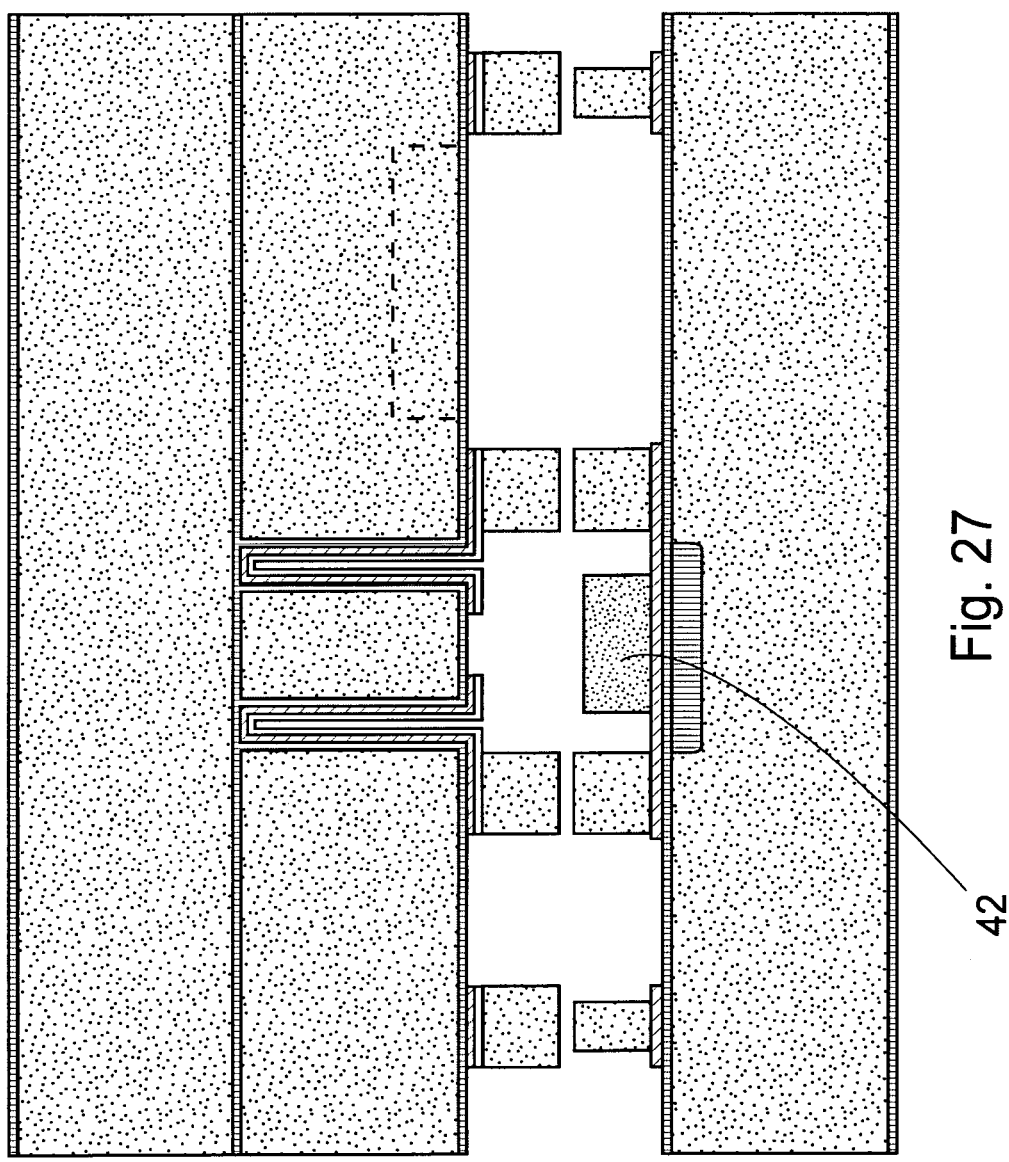

In order for the capping structure to be able to accommodate any components 42 on the component wafer that protrudes above the wafer surface, one can create cavities in the capping structure. In FIG. 27 such a cavity is indicated with a broken line. However, if the bonding/soldering structures are sufficiently high, as indicated in FIG. 27, the space provided between the wafers may suffice for accomodating the components without having to create cavities.

After having bonded the wafers together to arrive at the structure shown in FIG. 27, the handle is removed, but the oxide is left.

However, in order to provide contact to the wafer through connections, the oxide is opened up by suitable masking and etching through the oxide down to the metal. Again the wafer is patterned to provide a mask defining contact pads and other metal structures such as routing. Metal is applied in the holes and on the wafer whereby the desired metal structures are formed.

Figure 27B:
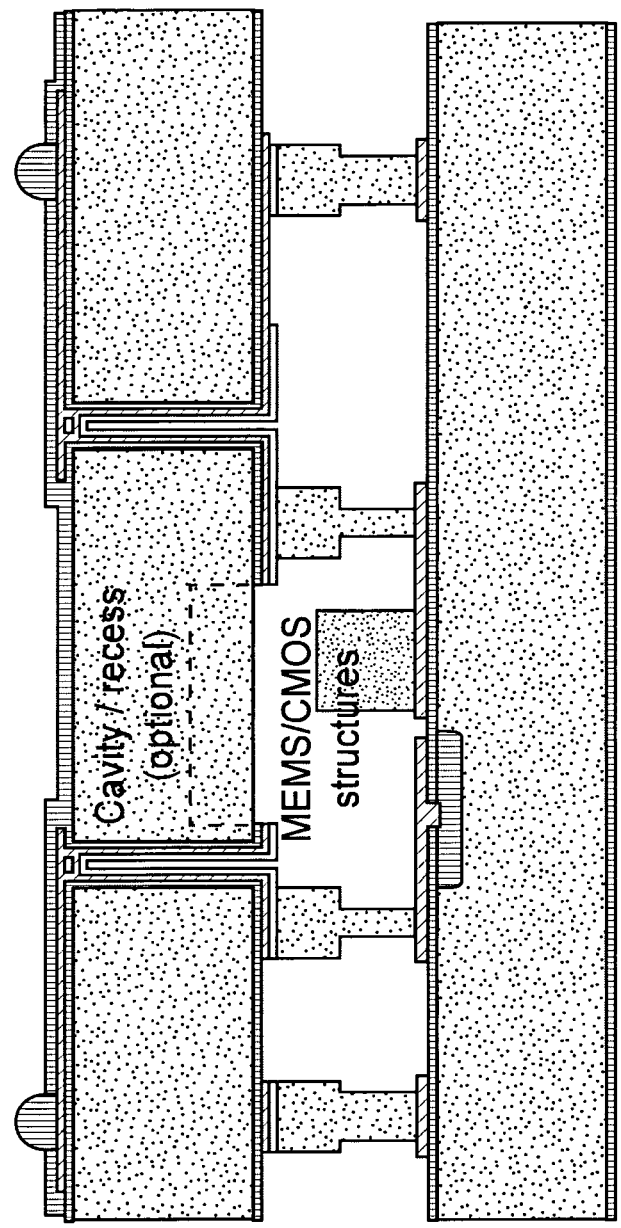

Again the surface is patterned with resist and suitably etched to prepare for applying a passivation layer on top of the wafer so as to cover the metal structures. Finally bumping is provided at desired locations by opening up the passivation layer to expose metal for attaching solder bumps. The final result is shown in FIG. 27b.

Alternatively, the contacts can be made by etching through the oxide when the holes are made. This requires two etch steps, one for the silicon and one for the oxide. Thereby the oxide etch is applied such the a slight "over-etch" into the handle is made.

Then the process is as for the ordinary process.

When the handle is removed, the metal in the through connection will protrude slightly above the buried oxide layer, and e.g. by grinding a flat surface having contact points will be provided.

The final result will be very similar to the result shown in FIG. 27b.

Suitably the next step is to make the core for the inductance if such is desirable.

To this end the entire wafer is masked and patterned to expose only the trenches for making the core. The masking can be made by covering the entire wafer with a film or by spinning a resist onto the wafer. The mask is opened up over those trenches that are to form the inductance core. Suitably electroplating is employed for filling the trenches with the desired metal. Preferably a Ni/Co alloy is used for this purpose. Thus, the core extends vertically into the wafer.

The inductance functionality described above can also be provided in other ways. For example such structures could also comprise a thin insulating segment, i.e. a filled trench, extending through the substrate but running in a helical pattern so as to form an inductance coil.

Next the wafer is masked and patterned as described above to expose remaining structures, i.e trenches for capacitor plates and for via structures. Again, plating is used for growing Au, Cu or Al to a thickness of at least a few µm with low resistivity. This will in most cases leave a void inside the holes/trenches.

Again, the structures created extend vertically into the wafer meaning low area consumption and thereby cost efficiency.

Preferably but optionally these voids are filled with a material that is compatible with the substrate wafer material in terms of coefficient of expansion, such that thermal impact will not cause the substrate to crack.

Suitable materials for filling are oxide (e.g. TEOS) or poly-silicon. Also polymers such as BCB, SO8 or polyimide are usable.

In a particularly preferred embodiment of the invention, routing structures, i.e. structural elements for connecting components, are made on the substrate in the same process sequence as described above. Such routing structures are narrow strips of metal.

There are two alternative procedures for making these routings.

In one embodiment the initial step of patterning and etching the trenches and holes is divided in two substeps. This is disclosed in WO 2007/089206. First the wafer is patterned to define the routing structures, and the wafer is subjected to an etch to a depth of only a few µm. Thereby shallow recesses or grooves are provided in the surface. Then the wafer is patterned again to provide the trenches and holes, as described above.

The reason for using this sequence is that it would be more difficult to spin resist on the more complicated topography provided by the deep trenches and holes, although the latter is possible. Also bonding of the capping wafer is more difficult with topography present.

When the metal is deposited onto the substrate the recessed will be entirely filled with metal and form conductive strips. In this way the routing structures will be provided in a recessed manner, i.e. they will be provided in the substrate surface rather than on it.

In an alternative embodiment the routing will be provided after the other structures have been made. Hereby the entire wafer is patterned after the final step of filling the voids (if applied), to define the routing structures. Metal is deposited on the wafer in the openings in the pattern. In this alternative the routing structures will be provide on the surface of the substrate.

These methods of making routing structures are suitable also for providing the metal strips forming an integral part of the winding (on the device layer side of the substrate) for the inductance as described above.

The metal strips for the inductance on the opposite side of the substrate are made after the capping substrate has been bonded to the CMOS/MEMS wafer, and will be described below.

An alternative method of making a capping structure as discussed above, is to refrain from using a SOI wafer as a starting substrate and instead start from a plain wafer. In this method the wafer thickness is at least 350 µm, suitably the thickness ranges between 200 and 1000 µm in order that the wafer can be handled in the process without risk of breaking or the need of special carrying systems.

Such a process will now be described with reference to the drawings FIGS. 1-13.

The first part of the process is to make vias (wafer through connections) in the starting substrate 10. This is schematically illustrated in FIG. 1. One side (here referred to as the "front side" FS) of a wafer is covered with a resist mask 12. This can either be in the form of a resist layer that is spun onto the wafer, or it can be a laminated resist film. A suitable thickness of the resist is 10 µm.

The resist film/layer is suitably patterned and exposed to open up holes 14 in the resist so as to define the via holes. The diameter of the holes can vary from 20 µm up to 150 µm. An etch, suitably Deep Reactive Ion Etch (DRIE) is then applied to the wafer through the resist mask to form holes with a depth in the range 270-570±5 µm.

It is important to have control over the etch parameters in order that the via will exhibit the desired properties. One of the most important properties to control is the wall slope in the hole that is being etched. The wall should preferably be 90°, i.e. the wall should extend vertically into the wafer. It is acceptable that it narrows slightly, i.e. that the wall has a "positive" slope. However, a "negative" slope indicating that the hole widens inwardly is not acceptable. The reason is that subsequent steps (e.g. plating) in the process will not function properly if the slope is "negative".

Also the wall roughness is an important property to control, in order to be able to achieve a continuous seed layer.

When the holes have been properly etched the resist is stripped away by conventional means (dissolving, etching etc.), and the wafer is subjected to thermal oxidation or similar processes for applying films, schematically illustrated in FIG. 2. Thereby a thin oxide layer 20 is grown on the wafer on the side of the wafer having the vias only. The oxide covers the walls and the bottom of the holes.

At this stage the wafer comprises holes extending into the wafer but not all the way through. In order to provide wafer through vias to enable that electrical signals are transferred through the wafer, these holes must be internally provided with metal, either as a coating on a wall or possibly by filling the entirely, and also providing a further connection to the other side.

Filling the holes entirely with metal will in cases of close packed vias bring about severe tension in the wafer due to the different thermal expansion coefficients of metal and silicon, respectively. Thus, it is desirable to make use of the wall coating alternative and still having closed holes.

For providing the required connection to the back side, the following process is performed.

As shown in FIG. 3 in the next step the wafer 10 is masked with resist 30, suitably 2 µm thick, on the other (back) side BS of the wafer to define openings 32 located such that they are essentially concentric with the vias. Suitable alignment is of course required, but such methods pertain to the field of the skilled man, and are thus not part of the present invention per se, and will not be discussed herein.

These openings form a pattern defining "back side" via holes. Etching through the openings in the mask will then provide holes which are substantially smaller than the via holes on the opposite side, typically between 8 and 16 µm in diameter.

As can be clearly seen in FIG. 3, the thermal oxide 20 in the "front side" via holes 14 will act as an etch stop layer for the narrow "back side" holes 32.

Etching of these "backside holes" is suitably made by DRIE and can be performed in different ways, essentially one of two: with or without "trumpet etch". A "trumpet etch" entails rounding of the circumferential edges of the holes in order to facilitate subsequent filling by plating.

The resist is stripped away by etching or dissolving and the oxide layer is also removed, suitably by HF etch, and the result is a "naked wafer" 10, shown in FIG. 4, with a through hole comprising two sections, one deep and wide section 14 on the front side and one shallow and narrow section 32 on the back side of the wafer. Again, the entire wafer is oxidized to provide a layer about 5000 Å thick (not explicitly shown in FIG. 5-13)), onto which a seed layer is deposited, suitably but not limited to a sequence of layers comprising: Ti100 Å/TiN400 Å/Ti100 Å+Cu4000 Å, schematically illustrated in FIG. 5. Preferably the seed layer is deposited by sputtering from both sides of the wafer.

Now, with reference to FIG. 6, the via holes will be coated internally on the walls filled, at least partially, with Cu by a plating process. Of course other metals are usable, e.g. gold. This is a single sided process, i.e. the plating is allowed to act only on one side, namely the front side FS where the deeper and wider holes are provided. To enable such one sided plating the front side is covered with a film 60 of resist which is suitably laminated (glued) to the wafer, which is shown in FIG. 6. Spinning the resist onto the wafer is not possible since the resist material would then enter into the via holes and it would be rather difficult to remove the resist from the holes before the etching. Also the back side is covered with a resist film 62 in the same way. The back side resist together with the oxide on the back side form the barrier structure mentioned earlier.

The front side resist is then patterned to open up areas 64 for plating.

Here not only the via holes are exposed, but the pattern also comprises lines and other structures for routing between vias but also between vias and more remote areas on the wafer if needed for the purpose of enabling attachment of other components.

The plating process is preferably a so called fountain plating process (SEMITOOL PARAGON™ plating systems and alike), which comprises flushing the wafer front side with a plating solution while applying a voltage to the wafer. In this way the plating solution efficiently penetrates into the via holes which have a fairly high aspect ratio, which would be difficult using a conventional immersion based process, which creates problems due to surface tension effects.

As can be seen in FIG. 6, the plating metal (e.g. Cu or Au) 66 extends into the front side via hole and covers the walls, but it also penetrates further, partially up into the back side via holes. In most cases the plating metal will fill the entire diameter of the narrow back side hole to provide a hermetic seal, but it cannot be guaranteed to 100% that this is the case. Therefore, a second plating form the back side is also performed, as illustrated in FIG. 7.

Here, the front side is entirely covered with a laminated resist film 70, so as to enable a single sided plating on the back side. For this purpose the back side is provided with a laminated resist film 72, and the resist is opened up 74 at the back side via holes as shown. However, it is to be noted that the opened up area is slightly larger that the actual via hole. Then a plating process is applied whereby the back side holes are filled with metal 76, suitably Cu or Au, and also a portion around the holes are plated to provide a "collar" forming a suitable contact pad for attaching further components. Of course the resist 72 can be patterned so as to also provide routing structures on the front side if desired.

The resist layers on both sides are now stripped off (see FIG. 8).

Since the resulting device is a capping structure, it requires bonding structures. Typically bonding of the capping structure to another substrate is achieved by thermo compression, or soldering, bond pads must be provided.

In particular it is required that there be provided sealing structures so as to enable the capping to provide a hermetic sealing of components inside the capping.

Thus, the wafer is again covered with a resist film 90 on the front side by lamination, and holes and areas are opened up to provide a mask defining the bond pads/bonding/sealing structures, as shown in FIG. 9. Then, stacked metal layer structures 100 are applied through the mask by electroplating, as shown in FIG. 10. Suitably the structure is made up of a first layer of Ni, a second layer of Au and a final layer of Sn. This process is a single sided process. The mating hole makes the wafer hermetic and solid.

Figure 12:
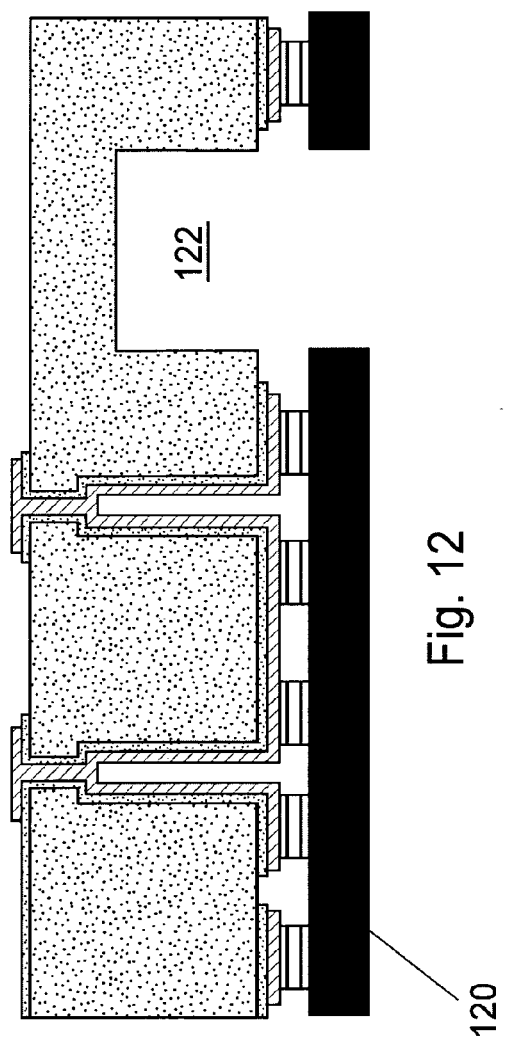
Figure 13A:
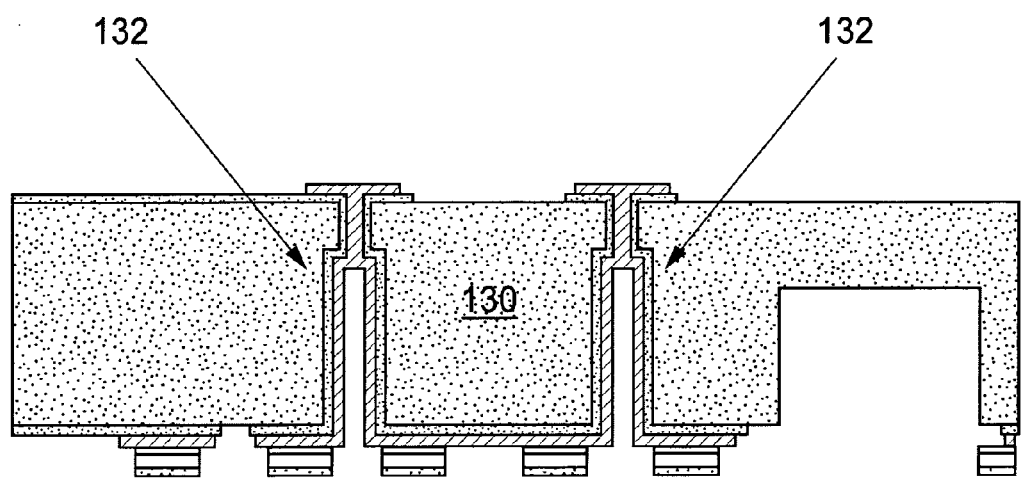

The resist is removed, see FIG. 11, and again a resist film 120 is laminated onto the wafer front side, see FIG. 12. This resist is also patterned thus forming a mask which define cavities 122 in the wafer, said cavities being provided so as to house components on the surface of the wafer to which the capping substrate is to be attached. A Deep Reactive Ion Etch (DRIE) is applied through the openings in the mask whereby the cavity forms. FIG. 13a shows the final result of the process, i.e. a capping structure 130 having vias 132 for routing signals from devices provided inside a hermetically sealed cavity.

Figure 13B:
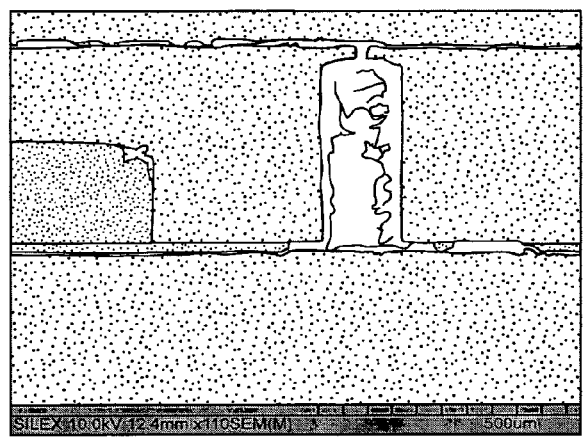
Figure 16:
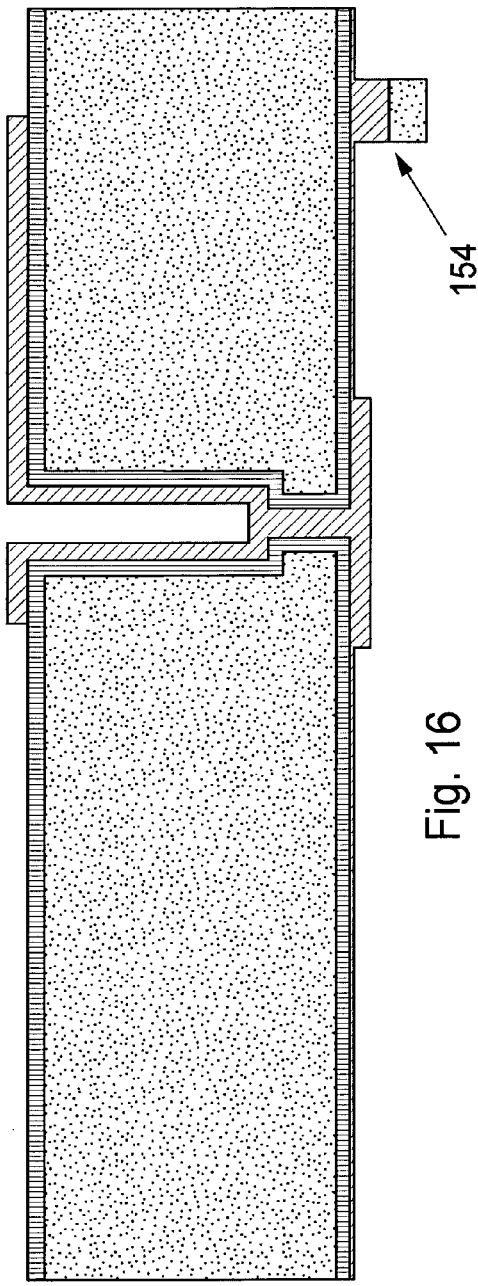

FIG. 13b is a SEM image of a capped device according to the invention fabricated with 200 mm diameter silicon wafers. The bonding is preferably made on an EVG Gemini bonder alike.

By the method disclosed above a hermetic seal of the wafer through via is ascertained, as with the previously described method when an SOI wafer was used as a starting substrate.

It should further be noted that a via structure having hermetic sealing properties can be made by other methods. One example is disclosed in international patent application WO 2009/005462 (Assignee: ÅSTC Aerospace AB). The method claimed in this application enables using an ordinary plain wafer as a starting substrate, and to position the hermetic seal at optional position vertically in the wafer through via.

In a variation of the above described method, it is possible to make a hermetic seal around each via structure using very thin "knife structures" encircling the vias. This variation is shown in FIGS. 14-19. The general methods above are used to make the vias, but the wafer containing the vias is turned "upside-down" compared to the above method, illustrated in FIG. 14. However, the very thin "knife" structures are made on the back-side of the wafer having the vias, i.e. on the side where the narrow via portions are provided.

In order to make such knife structures it is not possible to laminate resist onto the wafer, since the laminated film is too thick, and it is not possible to make the very thin structures forming the knives in a laminated resist. Thus a spinning method is preferably used to apply resist. Spinning requires an essentially flat surface, and thus the front-side of the wafer cannot be used for this purpose.

However, before the knives are made, a seal ring should be made for bonding the wafers together.

As shown in FIG. 15, resist 150 is spun onto the back-side BS of the wafer. The spun resist is patterned and grooves/trenches 152 are opened up in the resist. Said grooves are subsequently filled with suitable material, such as solder comprising Au/Sn, to form the required seal ring 154.

The resist is removed (FIG. 16) and a new resist 160 is spun onto the wafer (FIG. 17*a*), patterned to define the knife structures, grooves are opened up, and metal 162, preferably gold (Au) is deposited in the grooves, to provide the knives.

Figure 17A:
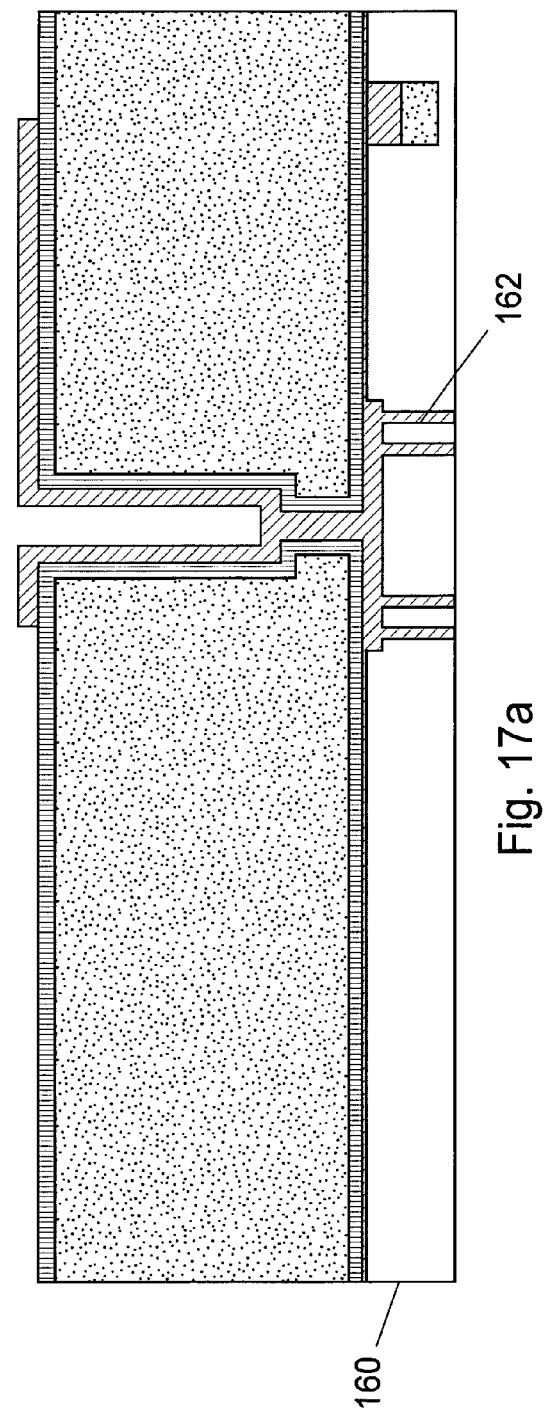

Suitably the seed layer that is still on the surface is removed by etching, either maskless or with a protecting resist mask. In FIG. 17*b-c* the resist mask from FIG. 17*a* is removed (FIG. 17*b*), and a new resist is applied to protect the knife structure and then the seed layer is removed (FIG. 17*c*).

Figure 18:
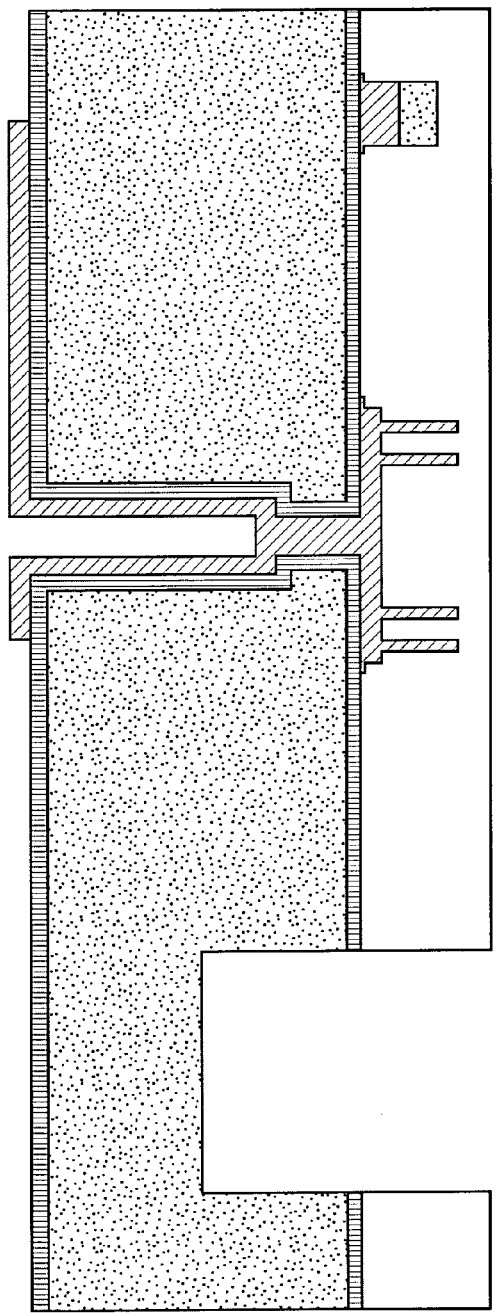

Then, the recesses forming the cavities for the housing the components on the other wafer are made after the knife structures have been made (see FIG. 18). Also here resist 180 is spun onto the wafer back-side, patterned to define the cavities 182 and etch is applied through the openings in the resist to make said cavity recesses.

Figure 19A:
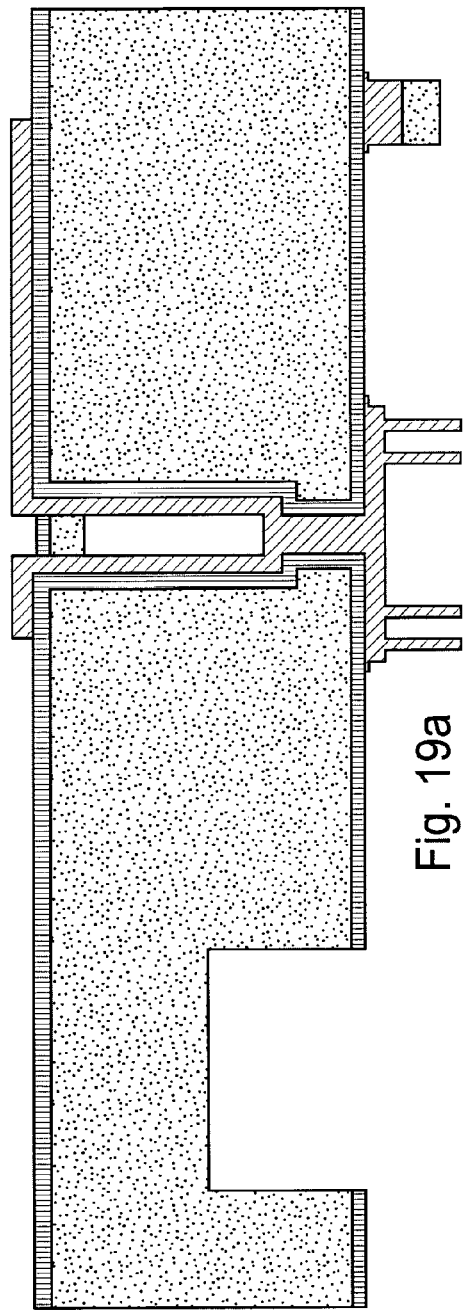
Figure 19B:
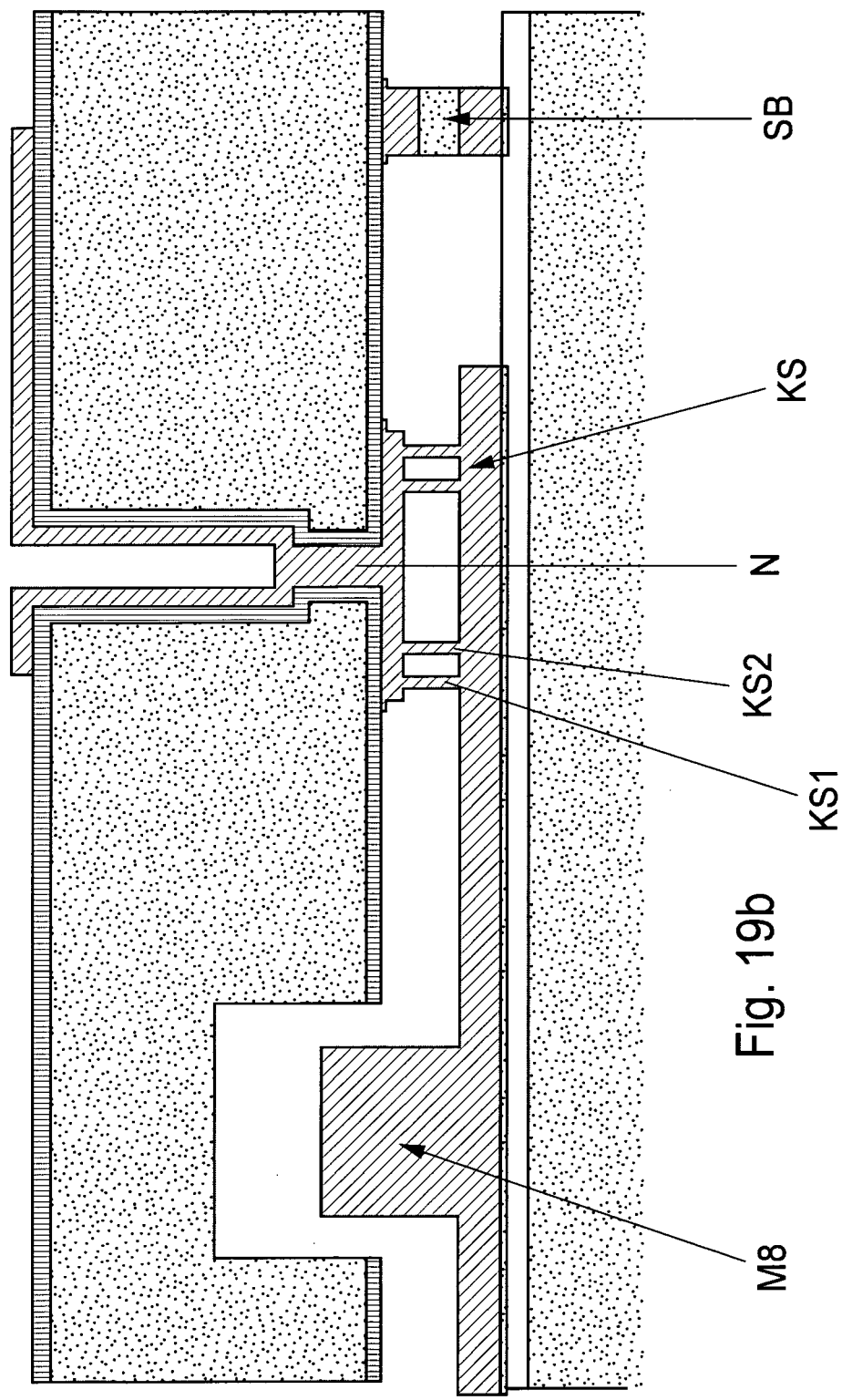

FIG. 19*a* shows a finished capping structure, and FIG. 19*b* shows a bonded structure comprising the capping from FIG. 19*a* bonded to a wafer having a MEMS structure MS and a knife structure KS and a sealing bond SB. Also, the fact the narrower part N of the through connection is filled with metal, which provides a sealing itself, in combination with the knife structure KS surrounding the through connection, creates a redundancy in the sealing, such that if one of the seal is defect, the other will still provide sealing. As indicated there can be concentric knife structures KS1, KS2 to further increase redundancy.

Figure 28:
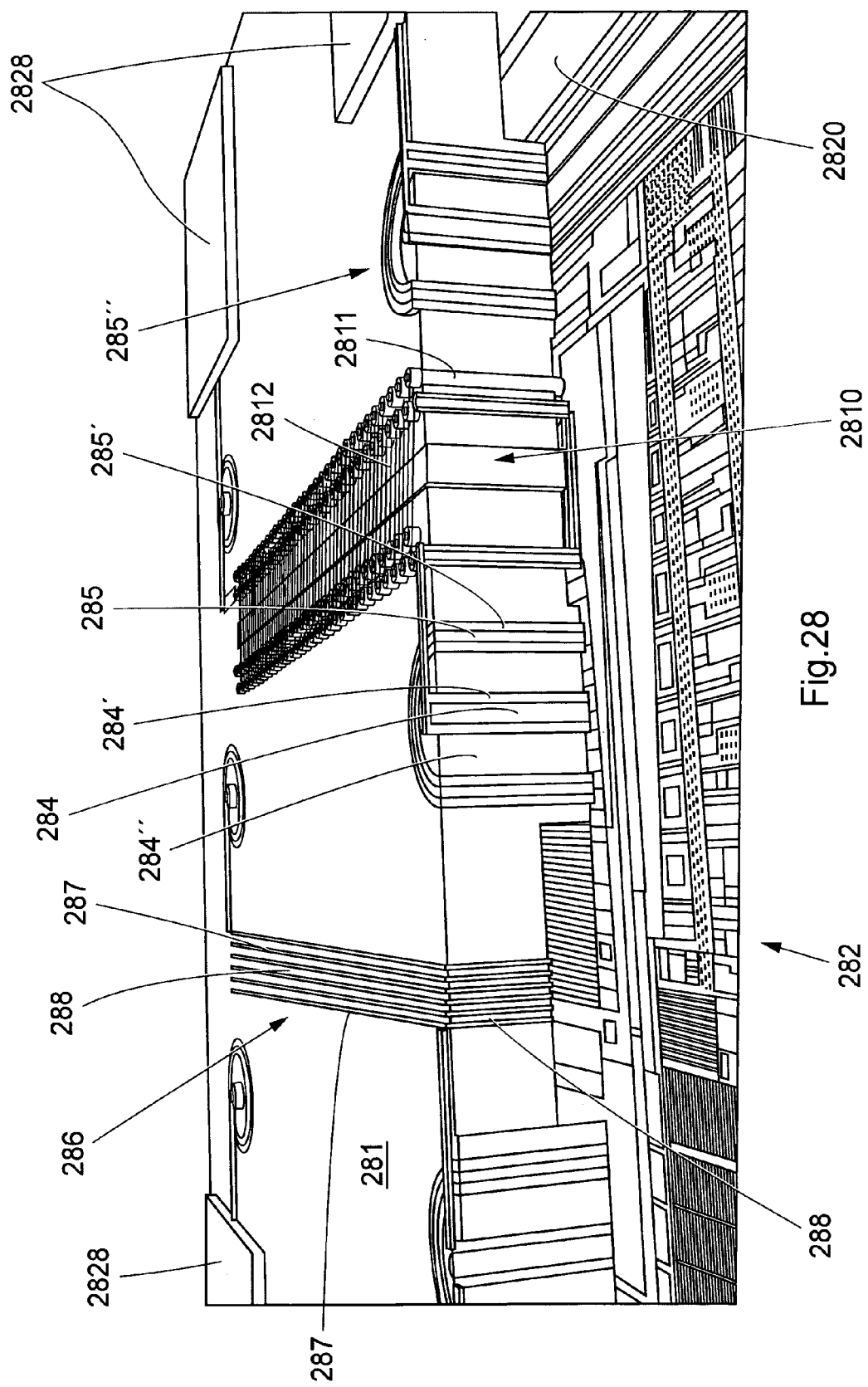
FIG. 28 shows a capping structure.

FIG. 28 is a cross-section in a perspective view of a functional capping substrate according to an embodiment of the invention, i.e. before having been bonded to a CMOS and/or MEMS device wafer. It should be noted that in FIG. 28 the upper oxide layer is not shown for clarity. Thus, all features shown as slightly protruding from the surface are buried in the oxide, and only the upper surfaces thereof are exposed. E.g. the inductance windings appear to be "free hanging" but are in fact supported on the oxide layer.

Thus, the shown device comprises generally a capping substrate 281, i.e. a cover structure for encapsulating, suitably hermetically sealing, CMOS or MEMS structures 282 (indicated below the capping substrate).

The capping substrate 281, suitably made of high resistivity silicon, although other materials are possible, comprises several functional components. There are also provided relatively wide recesses R for providing the compartments in which the CMOS/MEMS components are to be operated in a controlled atmosphere when the capping structure is bonded to a component wafer.

The primary functional feature is the provision of the wafer through connections, or via structures, generally represented by 2811, which indicates the beginning of an array of via structures.

In the most general form the metal via is a simple via, i.e just a metal "plug" extending through the substrate.

However, a "plug" is not necessarily solid but can be formed by coating the walls only of a hole.

For RF applications these vias are suitably made as coaxial electrical connections extending through the substrate thereby obtaining impedance matching.

In a further embodiment such coaxial vias comprise a metal "plug" extending through a wafer, with a thin insulting layer of e.g. oxide provided between metal and wafer material. At a radial distance there is provided an annular metal structure, thus enclosing the central metal "plug". This annular metal structure is also preferably insulated against the wafer material by thin insulating layers at both the inner and outer circumferences. The annular metal structure forms a shield, and together these structures form a coaxial through connection, providing impedance matched properties for RF signals.

In some embodiments of the coaxial connections (shown in FIG. 28) the central "plug" itself comprise a central portion 284 of a material that is compatible with the material in the wafer from which the substrate is made, e.g oxide (TEOS) or poly-silicon (or any other material that will have a similar coefficient of expansion as the wafer material from which the substrate is made). This central portion is surrounded by the metal 284' in an annular structure, through which electrical signals can be transferred. Thus, in this case the "plug" is a composite structure.

For very small dimensions the central plug can be entirely made from metal, i.e. there is no void created during manufacture that I subsequently filled, but the metal will fill the via entirely during manufacture.

Between metal and substrate material in the respective structures there is a thin oxide layer (not shown), so as to electrically insulate from the silicon in the substrate 281.

Furthermore, there is a structure 285, 285' arranged concentrically around and at a radial distance from the insulated metal via 284. Between the via 284 and this structure 285, 285' there is an annular silicon portion 284" surrounding the metal via 284'. The concentric structure is indicate at 285".

The concentric structure 285, 285' comprises two concentric, annular metal structures 285' between which (i.e. at 285) there is provided the same material as in the central portion 284, i.e. oxide (e.g. TEOS) or poly-silicon (or any other material that will have a similar coefficient of expansion as the wafer material from which the substrate is made).

The annular metal structure 285' will function as a shield to the centrally located via 284. Properly designed the impedance in such structure becomes 50 Ohm allowing RF signals transmitted in the metal via with minimum reflection and damping.

The overall structure will be that of a coaxial connection between the two sides of the capping substrate 281, thereby forming an ohmic connection between the MEMS/CMOS devices through the capping substrate to external devices.

Another functional feature of the capping substrate can be the provision of a capacitor structure 286 within the substrate. Such a capacitor structure is provided by having metal provided in thin segments 287 (six showing in FIG. 28) extending preferably all the way through the substrate and also extending across the plane of the substrate. If several such segments are arranged next to each other and in parallel as shown in FIG. 1, with only a very small spacing between them, the material segments 288 of the substrate between these insulating segments will have the function of capacitor plates.

A further functional feature is the provision of a "spiral" structure, formed by the vias and metal stripes, described below, forming a coil to provide an inductance.

The inductance comprises a metal core 2810 made of e.g. Ni or preferably a Ni/Co alloy, said core preferably extending through the substrate thickness, and having an elongated shape, extending essentially in the plane of the substrate. Furthermore, there is provided a winding around the core consisting of a combination of a plurality of via structures 2811, arranged in arrays along the metal core and extending through the substrate, and provided on both sides of the core 2810, and metal strips 2812 connecting via structures 2811 pair-wise across the core 2810. By letting the first via on one side of the core and on the upper surface of the substrate (as seen in the figure) connect to an opposing via provided on the other side of the core and then connecting said opposing via on the bottom side of the substrate (as seen in the figure) with an adjacent via to the first mentioned via, and so on, i.e. providing an essentially "zig-zag" connection between vias, a "spiral" wound conductor is provided around the metal core, thereby effectively creating an inductance.

In FIG. 28 there is shown a double array of vias arranged in a staggered configuration. This enables a closer spacing of metal strips, since the strips can be made narrower than the diameter of the was themselves. It is possible to provide triple or even quadruple arrays of vias. In this way the number of turns of the winding can be increased substantially and the properties of the inductance can be taylored to a higher degree.

The monolithic integrated capacitor and inductance features for replacing discretely mounted components. Using high effective capacitors, inductors and resistors various decoupling or filtering functions can be integrated.

For enabling a thermo compression bonding of the capping substrate to e.g. a CMOS/MEMS device it may be required to provide a metallization 2820 that runs circumferentially around the area defining the final device, corresponding to a mating metallization on the CMOS/MEMS device. Such metallization is preferably Au or Cu.

Also various eutectic bonding approaches are possible, e.g. Au/poly-silicon, AuSn/Au, or many other eutectic alloys (see patent application SE-0900590-1, not published).

A further preferred feature according to the invention is to actually not stop etching at the etch stop layer of the SOI wafer when holes and trenches are made in the initial stage of the process, but in fact to continue etching further down into the stop layer. It is also possible to etch through the stop layer entirely.

The advantage of this is that when the handle layer finally is removed, the metal deposited in the via holes will become exposed and can form contact surfaces without the need for further processing, such as patterning and etching to expose the metal. The exposed metal can then directly be plated or processed in other ways to provide pads 2822 for electrically coupling the CMOS/MEMS components to the via.

When all the desired functions and components have been made in the device layer of the SOI wafer, the entire wafer is optionally patterned again to define the wider recesses R that are to provide the hermetically sealed compartments with a controlled atmosphere, if such cavities are required by the topography of the component wafer. Suitable etching to a desired depth will result in appropriate hermetically sealed compartments.

At this stage the capping substrate is still provided with the SOI handle layer. Now it is to be bonded against the CMOS/MEMS substrate 282. To this end the circumferential metallizations are matched and pressed against each other whereby a hermetic tight seal 2820 is formed, either by thermo compression or by eutectic melting bonding.

After bonding together the capping structure and the CMOS/MEMS device, the handle layer is removed in conventional way, e.g. grinding or etching or any other method well known to the skilled man.

As already indicated, if the hole and trench etching was made through the insulator layer of the SOI wafer, the metal deposited in the holes and trenches will be exposed and form suitable contact points for providing contact pads for further connection. At this stage also back side routing is made in a similar manner as already described above.

It should be noted that the cross connecting metal strips of the inductance is now made, suitably at the same time as the other routing structures. By making bumps 2828 of solderable material (e.g. Ni/Au), surface mounting for example flip-chip type mounting will become possible.

In a further preferred embodiment there can be provided insulating enclosures surrounding selected elements in the capping substrate. Such insulating enclosures prevent "cross-talk" between components and regions, thereby minimizing signal strength losses. Methods for making such enclosures are disclosed in applicants own international patent application WO 2008/091220.

The invention claimed is:

1. Capping substrate for a semiconductor device, comprising a passive integrated component which is an inductance comprising a metal core and a winding comprising a combination of a plurality of via structures (11), arranged in arrays and extending through a substrate, and metal strips (12) which connect the via structures pair-wise;

wherein a first via located on one side of the metal core is coupled on the upper surface by at least one metal strip to an opposing via on the opposite side of the metal core and wherein said opposing via is interconnected on a bottom surface of the substrate by at least one metal strip with a second via adjacent to the first via, such that there is essentiallya continuous formation extending between and coupling the vias, thereby producing a conductor around the metal core;

wherein said via structures are coaxial metal through connections comprising at least one insulated metal through connection extending through the substrate; at least one annular metal structure circumferentially surrounding said insulated metal through connection, and located at a finite radial distance therefrom.

2. Capping structure as claimed in claim 1, wherein the inductance is provided by an elongated metal core extending in the substrate and through it.

3. Capping structure as claimed in claim 2, wherein said core extends through the substrate thickness, and has an elongated shape, extending essentially in the plane of the substrate.

4. Capping structure as claimed in claim 2, wherein said core is made of Ni or a Ni/Co alloy.

5. Capping structure as claimed in claim 1, wherein there are double arrays of vias arranged in a staggered configuration.

6. Capping structure as claimed in claim 1, wherein there are triple or quadruple arrays of vias.

7. A micro-electronic and/or micro-mechanic device having a capping structure as claimed in claim 1.

8. The device as claimed in claim 7 which is a MEMS and/or CMOS device.

* * * * *